United States Patent
Osone et al.

(10) Patent No.: US 7,554,193 B2
(45) Date of Patent: Jun. 30, 2009

(54) SEMICONDUCTOR DEVICE

(75) Inventors: Yasuo Osone, Kasumigaura (JP); Chiko Yorita, Fujisawa (JP); Kenya Kawano, Hitachinaka (JP); Yu Hasegawa, Saku (JP); Yuji Shirai, Hamura (JP); Seiichi Tomoi, Saku (JP); Tsuneo Endou, Komoro (JP); Satoru Konishi, Saku (JP); Hirokazu Nakajima, Saku (JP)

(73) Assignee: Renesas Technology Corp., Tokyo (JP)

( * ) Notice: Subject to any disclaimer, the term of this patent is extended or adjusted under 35 U.S.C. 154(b) by 97 days.

(21) Appl. No.: 11/504,736

(22) Filed: Aug. 16, 2006

(65) Prior Publication Data

US 2007/0040255 A1 Feb. 22, 2007

(30) Foreign Application Priority Data

Aug. 16, 2005 (JP) ............................. 2005-235638
Mar. 30, 2006 (JP) ............................. 2006-093000

(51) Int. Cl.
*H01L 23/34* (2006.01)
*H01L 23/48* (2006.01)

(52) U.S. Cl. ....................... 257/713; 257/701; 257/778; 257/774; 257/E23.011

(58) Field of Classification Search ................. 257/774, 257/778, E23.011, 701, 713
See application file for complete search history.

(56) References Cited

U.S. PATENT DOCUMENTS 6,130,483 A * 10/2000 Shizuki et al. .............. 257/778
6,329,656 B1 * 12/2001 Whatmore ................ 250/338.2
6,384,701 B1 * 5/2002 Yamada et al. .............. 333/247
6,492,692 B1 * 12/2002 Ishii et al. .................... 257/408
2006/0073664 A1 * 4/2006 Kondo et al. ................. 438/301

FOREIGN PATENT DOCUMENTS

| JP | 06-260532 | 9/1994 |
| JP | 11-026633 | 1/1999 |
| JP | 2001-102483 | 4/2001 |
| JP | 2003-282631 | 10/2003 |

* cited by examiner

*Primary Examiner*—Nitin Parekh
(74) *Attorney, Agent, or Firm*—Antonelli, Terry, Stout & Kraus, LLP.

(57) ABSTRACT

A semiconductor device capable of reducing the thermal resistance in a flip chip packaging structure while achieving both the high radiation performance and manufacturing readiness without increasing the manufacturing cost is provided. In a semiconductor device having a semiconductor circuit for power amplification and a control circuit of the semiconductor circuit laminated on a multilayer circuit board, the semiconductor circuit for power amplification and the control circuit are aligned in parallel on the same semiconductor element, and the semiconductor element is flip-chip connected on the multilayer circuit board. Further, a second semiconductor element mounted in addition to the first semiconductor element and all components and submodules are flip-chip connected. Also, a plurality of bumps are united in order to improve the radiation performance and thermal vias of the multilayer circuit board are formed in second and lower layers of the wiring layers in the multilayer circuit board.

6 Claims, 23 Drawing Sheets

SEMICONDUCTOR DEVICE

CROSS-REFERENCE TO RELATED APPLICATION

The present application claims priority from Japanese Patent Application No. JP 2005-235638 filed on Aug. 16, 2005 and Japanese Patent Application No. JP 2006-093000 filed on Mar. 30, 2006, the contents of which are hereby incorporated by reference into this application.

TECHNICAL FIELD OF THE INVENTION

The present invention relates to a technology effectively applied to a thermal design of a semiconductor device for a radio-frequency transmitter and receiver module and a semiconductor power supply mounted in a personal digital assistant such as a cellular phone.

BACKGROUND OF THE INVENTION

As a technology for a thermal design of a power semiconductor device for a radio-frequency transmitter and receiver module mounted in a personal digital assistant such as a cellular phone, a packaging structure for reducing its thermal resistance is disclosed in Japanese Patent Application Laid-Open Publication No. 2001-102483 (Patent Document 1) and Japanese Patent Application Laid-Open Publication No. 2003-282631 (Patent Document 2). In the packaging structure disclosed in the Patent Document 1, a face-up packaging in which a circuit forming area (active area) of a semiconductor element 7 is located on an upper surface of the element is employed as shown in the cross-sectional view of FIG. 1. Further, a thermal conductive material being a connecting member is used between a lower portion of the element and a multilayer circuit board 1, and the thermal conductive material functions as a so-called heat spreader 5. Note that, in FIG. 1, a reference numeral 2 denotes molding resin, 3 denotes a bonding wire, 4 denotes a joint member, 6 denotes a joint member, and 8 denotes a thermal via.

On the other hand, in the packaging structure disclosed in the Patent Document 2, a semiconductor element 7 is placed on a multilayer circuit board 1 in a face-down manner, that is, by a flip chip connection method where an active area is faced to a lower surface side of the element as shown in the cross-sectional view of FIG. 2. In this case, by using a large-area bump structure for use only for the heat radiation, the heat is efficiently radiated to the circuit board. Note that, in FIG. 2, a reference numeral 9 denotes an electrical connection electrode, 10 denotes a electrical connection bump, 11 denotes an insulating layer, 12 denotes a heat radiation electrode, and 13 denotes a heat radiation bump.

Also, an example of a structure for improving the radiation performance of a flip-chip-connected semiconductor element is disclosed in Japanese Patent Application Laid-Open Publication No. 6-260532 (Patent Document 3).

SUMMARY OF THE INVENTION

Incidentally, the conventional technology disclosed in the Patent Document 1 has the problems as follows. That is, since the thermal conductive material functioning as a heat spreader has only a function to connect a rear surface of the semiconductor element and the circuit board in terms of circuit configuration, when a signal wiring is provided by means of wire bonding and the like, the packaging area is increased. Further, since the numbers of components, required connecting members, and packaging processes thereof are increased by adding the heat spreader, the cost of a product is increased.

On the other hand, the conventional technology disclosed in the Patent Document 2 also has the problems as follows. That is, although the effect of reducing the thermal resistance can be expected from the flip chip packaging, since a thick interlayer insulating film is provided between a main heat generating area of a semiconductor element and heat radiation bump, the thermal resistance reducing effect is limited. Also, when the heat radiation bump and the electrical connection bump have different heights and a solder bump is used, a complicated and expensive packaging process is required in order to package the respective bumps with sufficient adhesiveness. As a result, the manufacturing cost is increased.

Further, in the conventional technology disclosed in the Patent Document 3, a structure is disclosed, in which holes are formed in a circuit board and the holes are filled with metal to release the heat from the semiconductor element. In this structure, the radiation performance higher than that of the conventional technology disclosed in the Patent Document 2 can be expected. However, it is difficult to form holes in a board to fill the holes with metal and then adjust the height of protruding portions of the metal from the board, and since the linear expansion coefficient is difficult between the electrical connection bump and the metal to be filled, it is difficult to apply this technology to a product mounted in a cellular phone or the like used in a relatively wide temperature range.

In such a circumstance, an object of the present invention is to provide a semiconductor device capable of reducing the thermal resistance of a flip chip packaging structure while achieving both the high radiation performance and manufacturing readiness without increasing the manufacturing cost.

The above and other objects and novel characteristics of the present invention will be apparent from the description of this specification and the accompanying drawings.

The typical ones of the inventions disclosed in this application will be briefly described as follows.

For the achievement of the object described above, the feature of the present invention lies in that, of the semiconductor devices used in a personal digital assistant such as a cellular phone, a semiconductor device having a power supply circuit device and a transmission power amplifier such as a power amplifier is packaged by a flip chip connection. When the semiconductor device is packaged by the flip chip connection, the high radiation performance and the manufacturing readiness can be achieved at the same time by forming the electrical connection bump and the heat radiation bump from the same material and with the same height.

The effects obtained by typical aspects of the present invention will be briefly described below.

According to the present invention, a packaging structure, which can achieve both the improvement of the radiation performance and the mass productivity in the manufacturing process in the case where a semiconductor element is flip-chip connected, can be provided for semiconductor devices such as a power amplifier and a power supply module mounted in a personal digital assistant such as a cellular phone.

Also, according to the present invention, a strip-shaped heat radiation bump formed in the periphery of a semiconductor element and a normal signal connection bump are designed to have the approximately same width. By this means, it is possible to prevent the occurrence of variation in height of the bumps due to the surface tension of the melted solder caused when the solder bumps are adopted. As a result, the flip chip packaging structure with good connectivity can be achieved.

Further, according to the present invention, a thermal via group is disposed in the second and lower wiring layers of a multilayer circuit board. Therefore, the heat from the strip-shaped heat radiation bump to the multilayer circuit board can be efficiently radiated to a rear surface of the multilayer circuit board.

BRIEF DESCRIPTIONS OF THE DRAWINGS

Figure 23:
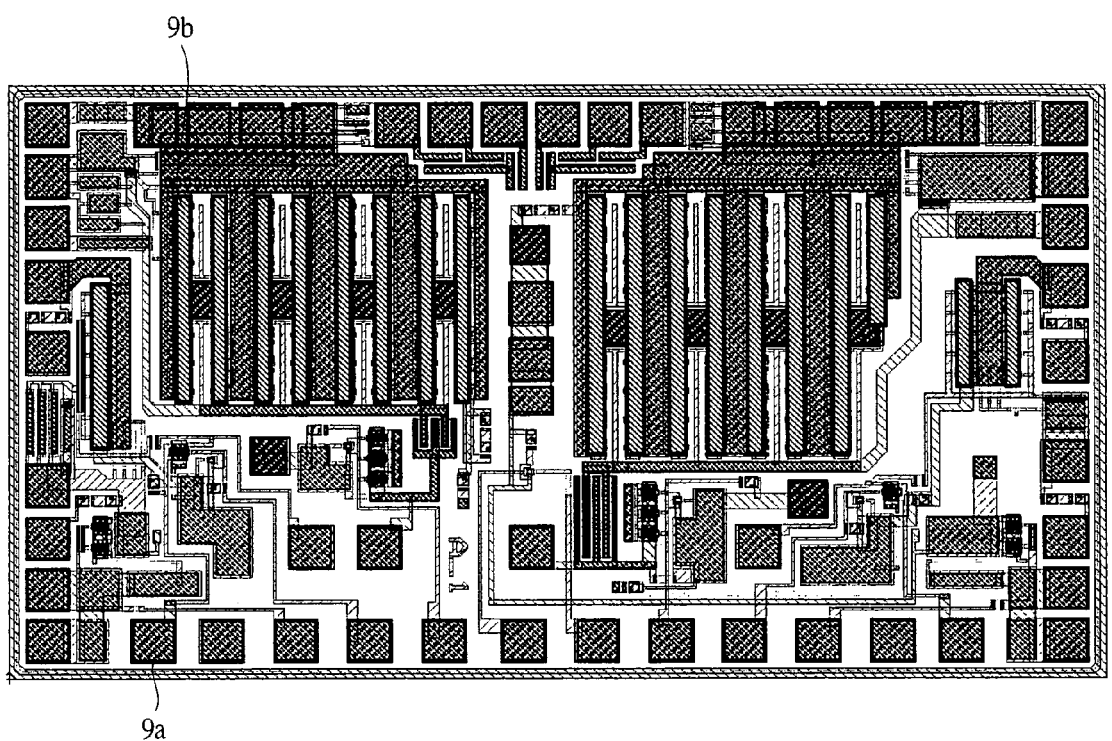
Figure 24:
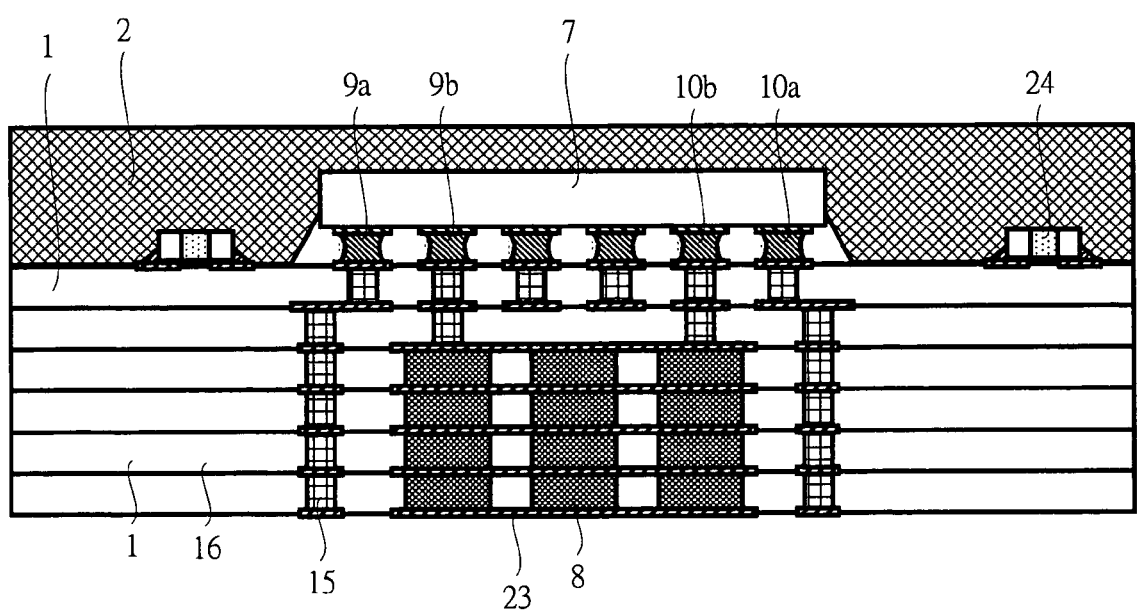

FIG. 23 is a diagram showing the example where the emitter electrodes of HBTs are united to form a strip-shaped electrode in the layout of the element bump electrodes in the semiconductor device according to the sixth embodiment of the present invention; and FIG. 24 is a cross-sectional view showing a packaging structure of the semiconductor device (in which components and submodules other than the semiconductor element are also mounted) according to the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, in the cross-sectional views of the drawings, illustration of the cross-sectional structure is partly omitted in order to make the drawings easy to see.

The embodiments of the present invention are applied to a semiconductor device in which a semiconductor circuit for power amplification or signal amplification and a control circuit for controlling the semiconductor circuit are laminated on a multilayer circuit board, and the feature thereof lies in that the semiconductor circuit and the control circuit are disposed in parallel on the same semiconductor element and the semiconductor element is flip-chip connected on the multilayer circuit board. Also, another feature thereof lies in that, in the case of the semiconductor circuit for signal amplification, a plurality of amplifier circuits for amplifying the signals of a plurality of bands are provided in parallel, and the control circuit and the plurality of amplifier circuits are disposed in parallel on the same semiconductor element so that the control circuit is surrounded by the plurality of amplifier circuits. The embodiments of the present invention including these features will be described below in detail.

First Embodiment

Figure 1:
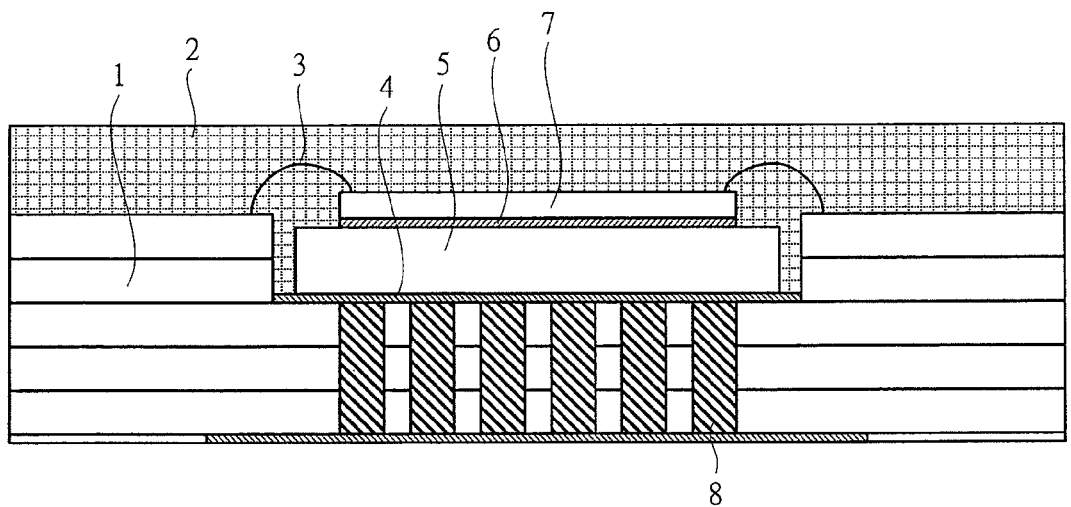
FIG. 1 is a cross-sectional view showing a packaging structure of a conventional semiconductor device (Patent Document 1)
Figure 2:
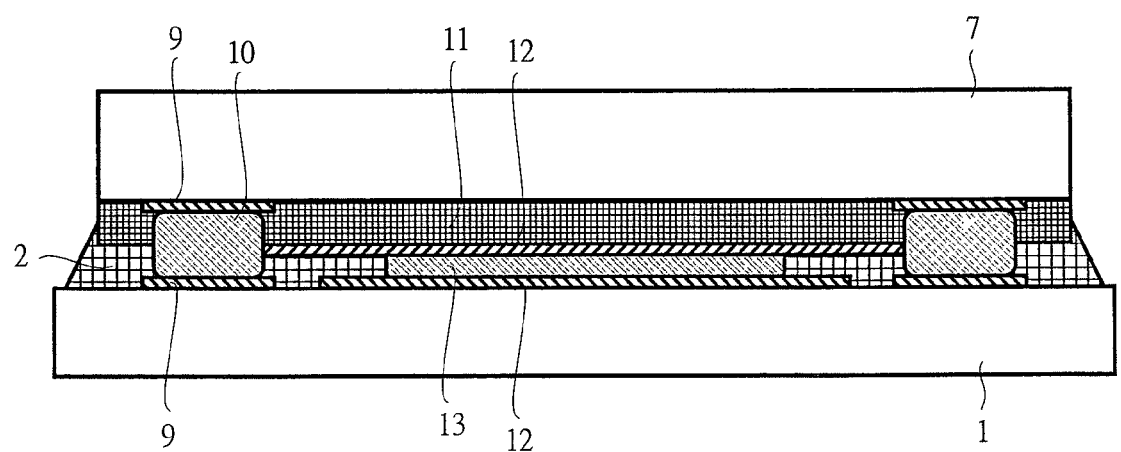
FIG. 2 is a cross-sectional view showing a packaging structure of a conventional semiconductor device (Patent Document 2)
Figure 3:
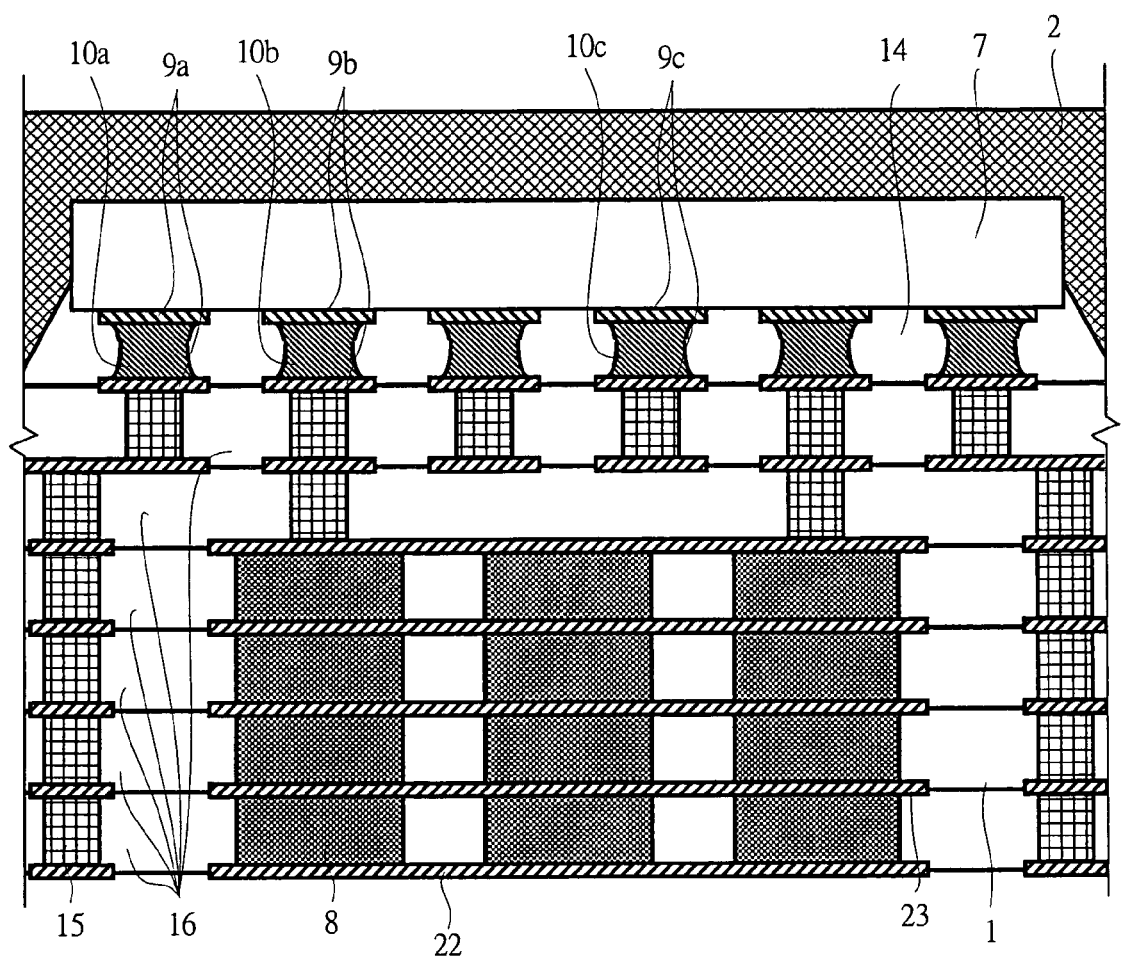
FIG. 3 is a cross-sectional view showing a packaging structure of a semiconductor device according to the first embodiment of the present invention.
Figure 4:
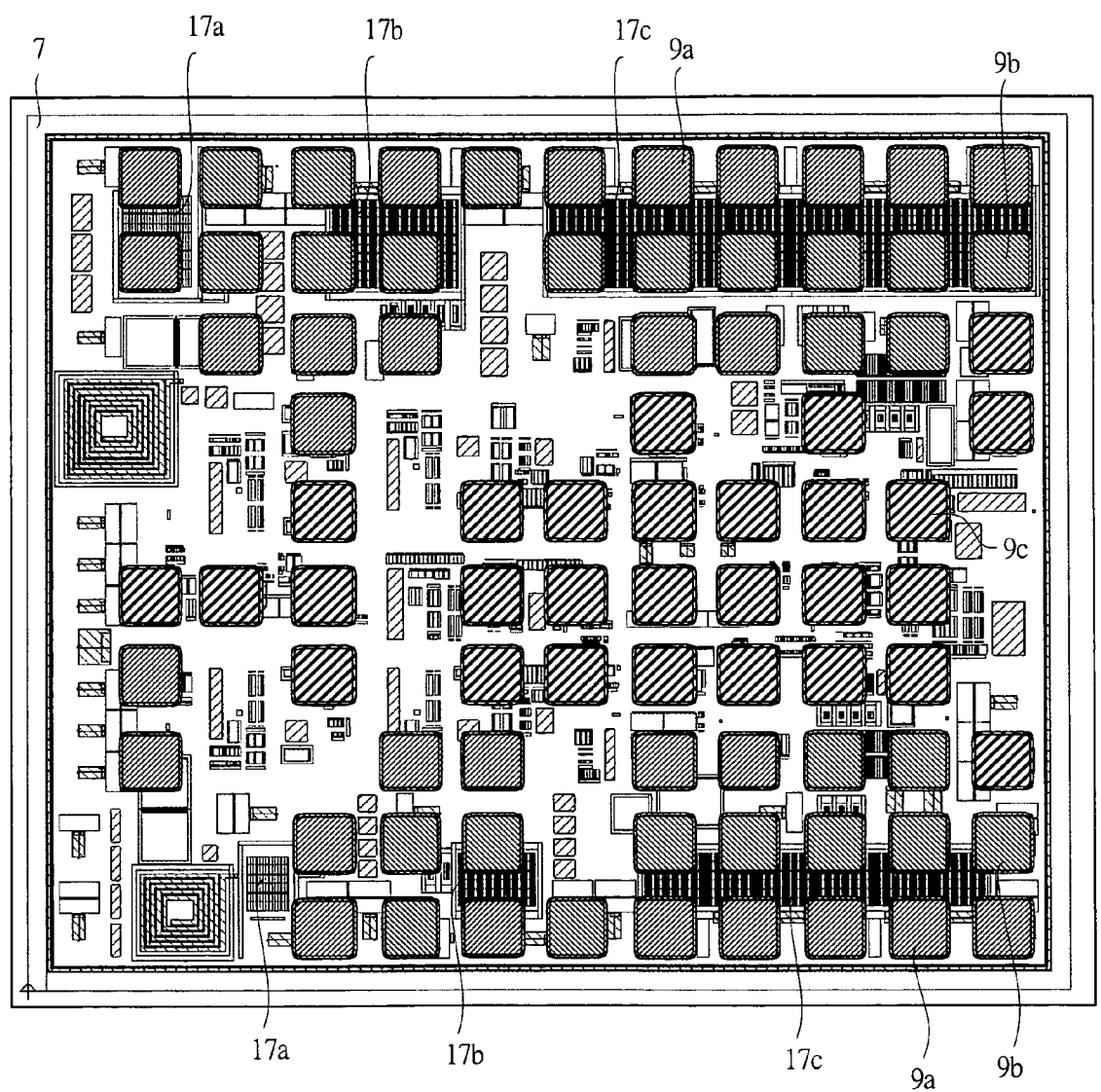
FIG. 4 is a diagram showing a layout of element bump electrodes in the semiconductor device according to the first embodiment of the present invention.
Figure 5:
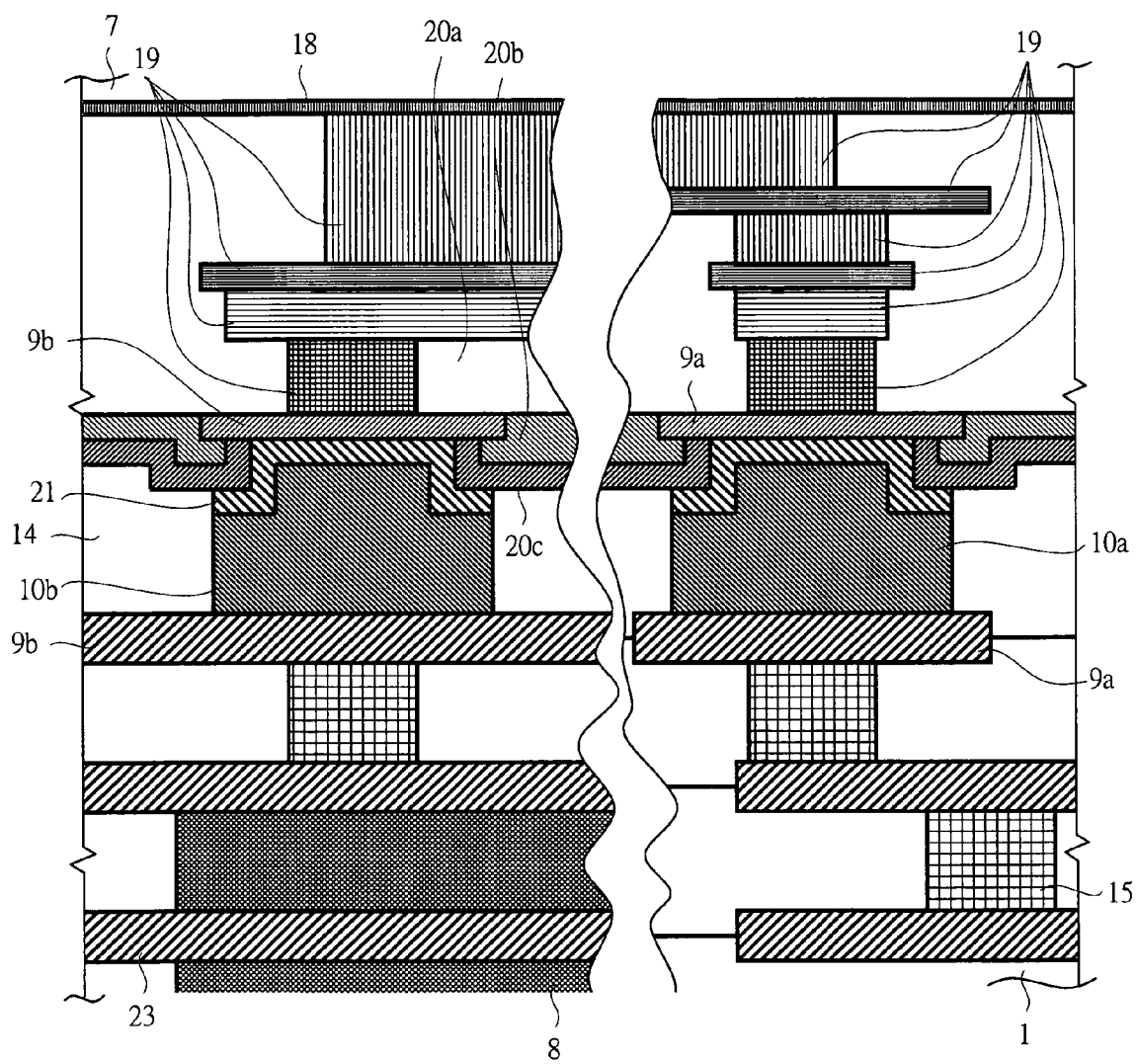
FIG. 5 is a cross-sectional view showing a connection structure from an active area to a circuit board in the semiconductor device according to the first embodiment of the present invention.
Figure 6:
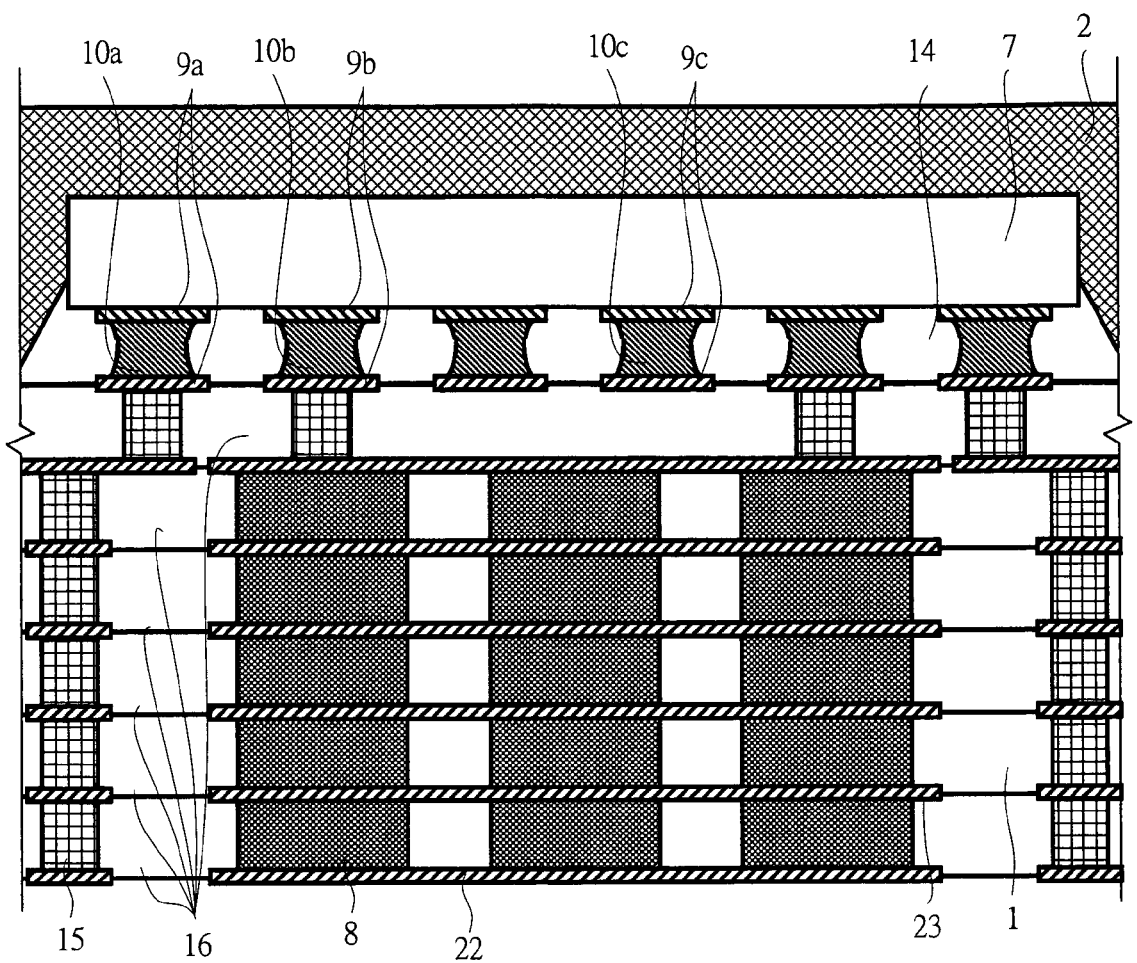
FIG. 6 is a cross-sectional view showing a packaging structure of the semiconductor device in which thermal vias are formed in the second and lower layers of the circuit board according to the first embodiment of the present invention.
Figure 7:
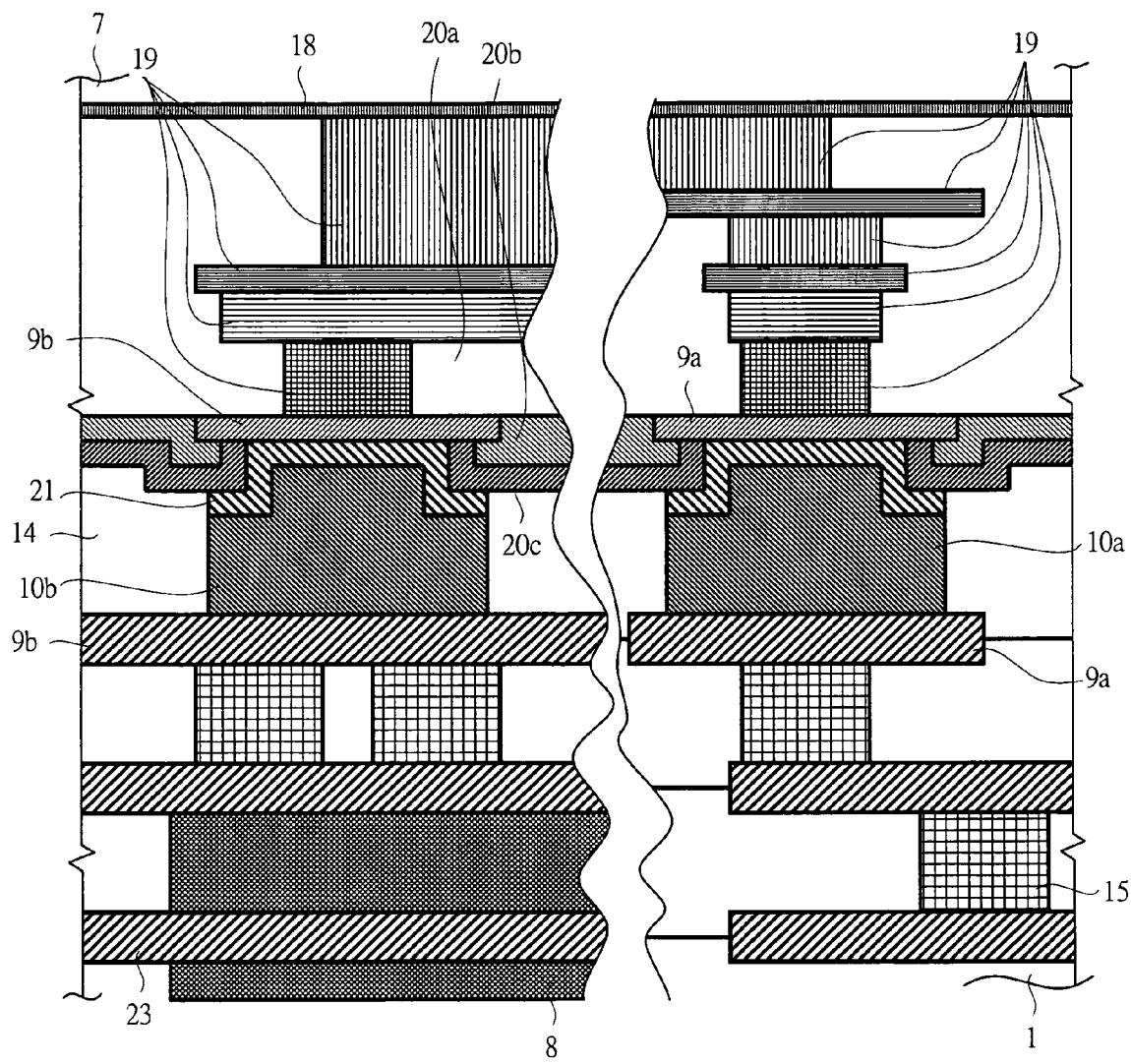
FIG. 7 is a cross-sectional view showing another connection structure from an active area to a circuit board in the semiconductor device according to the first embodiment of the present invention.
Figure 8:
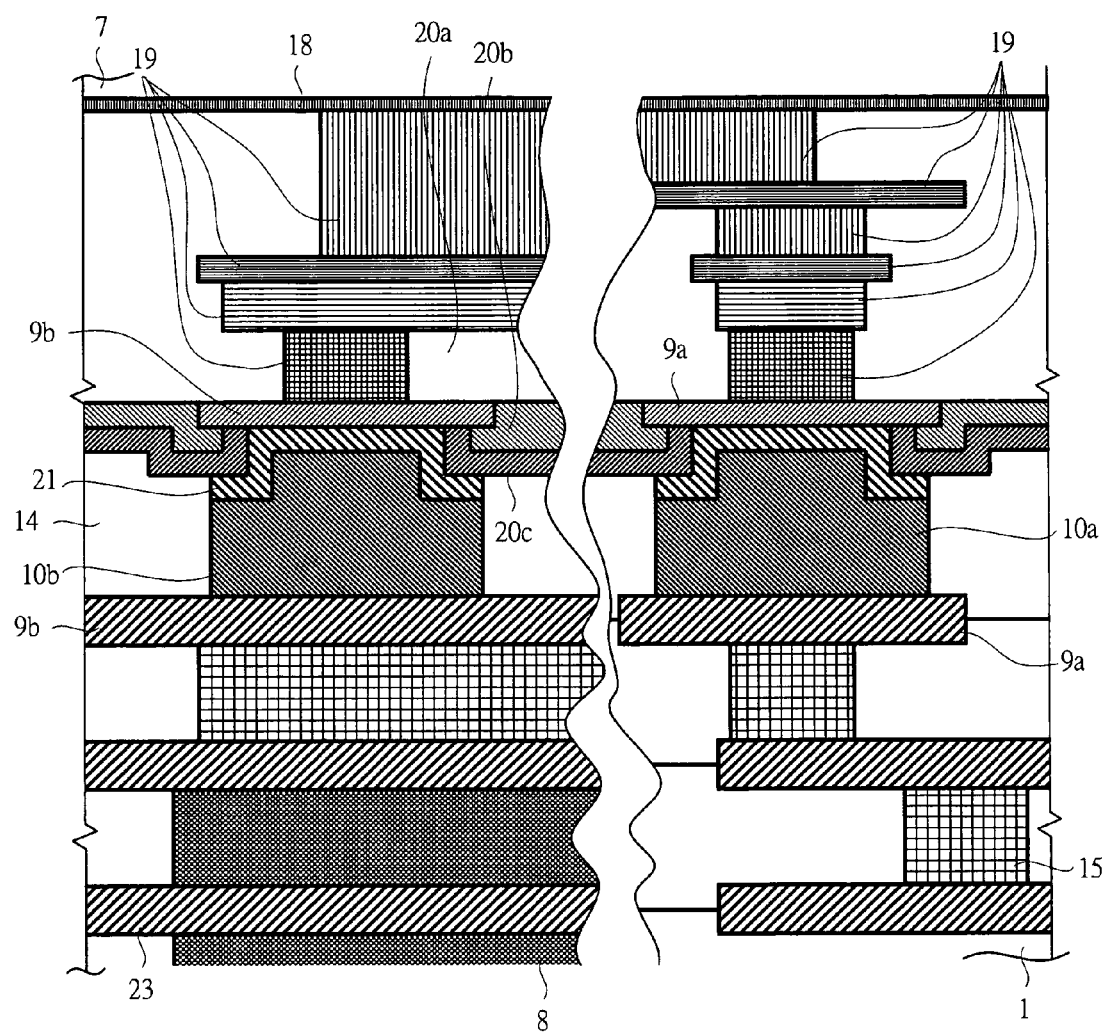
FIG. 8 is a cross-sectional view showing still another connection structure from an active area to a circuit board in the semiconductor device according to the first embodiment of the present invention.
Figure 9:
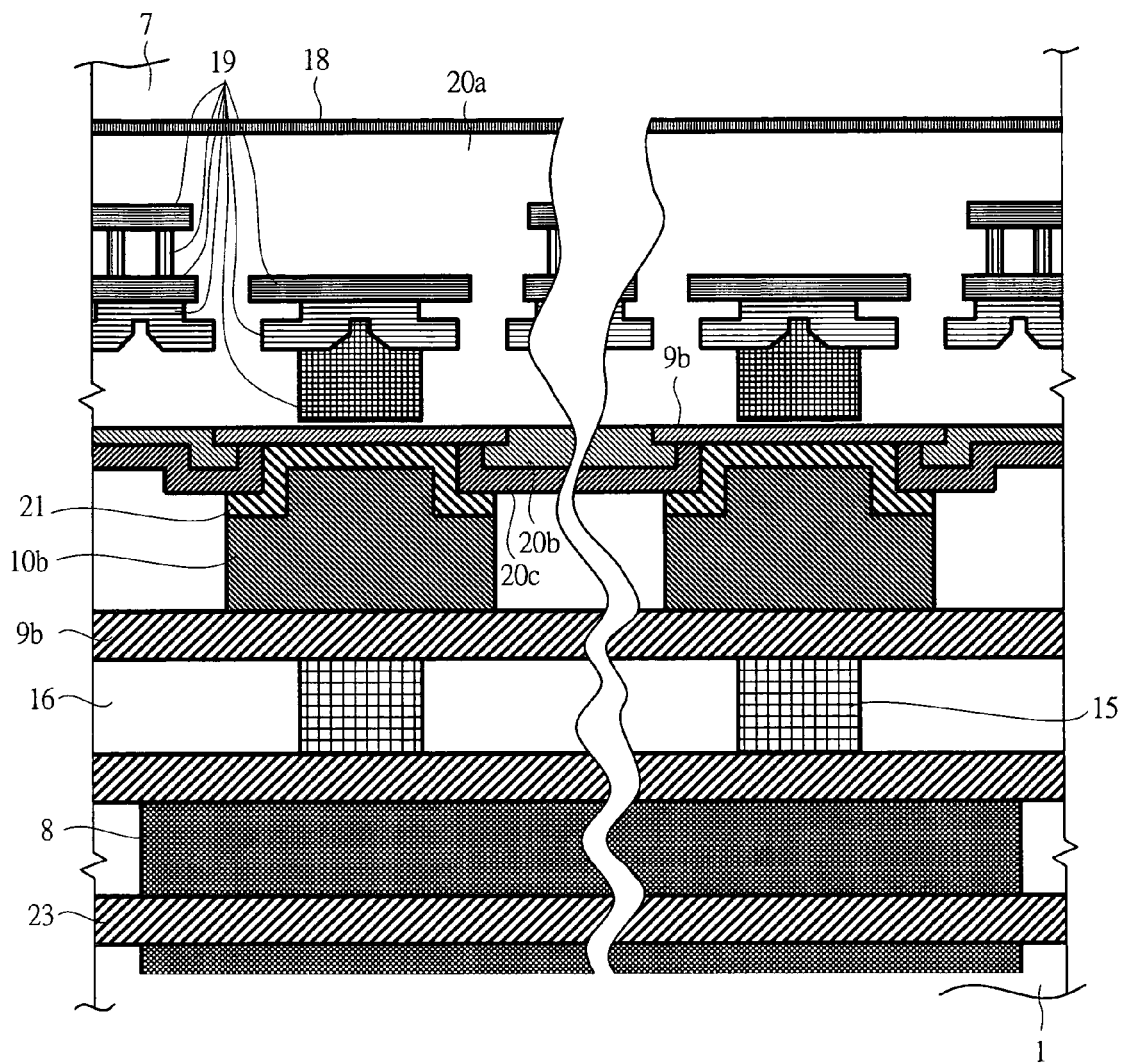
FIG. 9 is a cross-sectional view showing a connection structure from an active area to a thermal via in the wiring layers on the source or emitter side in the semiconductor device according to the first embodiment of the present invention.

A semiconductor device according to the present invention will be described with reference to FIG. 3 to FIG. 9. FIG. 3 is a cross-sectional view showing a packaging structure of a semiconductor device. FIG. 4 is a diagram showing the layout of element bump electrodes in the semiconductor device. FIG. 5 is a cross-sectional view showing a connection structure from an active area to a circuit board in the semiconductor device. FIG. 6 is a cross-sectional view showing a packaging structure of the semiconductor device in which thermal vias are formed in the second and lower layers of the circuit board. FIG. 7 is a cross-sectional view showing another connection structure from an active area to a circuit board in the semiconductor device. FIG. 8 is a cross-sectional view showing still another connection structure from an active area to a circuit board in the semiconductor device. FIG. 9 is a cross-sectional view showing a connection structure from an active area to a thermal via in the wiring layers on the source or emitter side in the semiconductor device.

As shown in FIG. 3, a semiconductor device according to this embodiment comprises: a multilayer circuit board 1; molding resin 2; a semiconductor element 7; thermal vias 8; drain or gate electrodes or collector or base electrodes 9a; source or emitter electrodes 9b; control circuit electrodes 9c; drain or gate bumps or collector or base bumps 10a; source or emitter bumps 10b; control circuit bumps 10c; underfill resin 14; interlayer connection vias 15; insulating layers 16; a ground electrode 22; wiring layers 23; and others.

In this semiconductor device, the semiconductor element 7 is mounted on the multilayer circuit board 1 by the flip chip connection. In this structure, the drain or gate electrode or collector or base electrode 9a of the semiconductor element 7 is connected to the drain or gate electrode or collector or base electrode 9a of the multilayer circuit board 1 via the drain or gate bump or collector or base bump 10a. Also, the source or emitter electrode 9b of the semiconductor element 7 is connected to the source or emitter electrode 9b of the circuit board 1 via the source or emitter bump 10b.

In the case of a power supply circuit and a power amplifier to which the embodiment is to be applied, circuits for outputting signals and electric power and a circuit for controlling the circuits are formed on the same semiconductor element to increase the packaging density. By this means, the area of the semiconductor element 7 is reduced and the request for reducing the component size is satisfied. Therefore, particularly in the case of a circuit for amplifying the signals of a plurality of standards and bands, a control circuit is formed at the center of the semiconductor element 7 and signal amplifier circuits and power supply circuits are formed in the periphery thereof. In these circuits, the heating value is large in a final output transistor in the signal amplifier circuits and the power supply circuits formed in the periphery, and the improvement of the radiation performance is required therein. In the layout shown in FIG. 4, the final output transistor corresponds to an output stage 17c among from a first stage 17a, a second stage 17b and the output stage 17c in the active area for signal amplification. In this embodiment, the active areas which mainly generate heat are localized in the edge parts of the semiconductor element 7 as shown in FIG. 4.

FIG. 5 is a cross-sectional view showing the connection structure of the electrodes from the semiconductor element 7 to the multilayer circuit board 1 in the embodiment shown in FIG. 3 and FIG. 4. As shown in FIG. 5, the semiconductor element 7 mounted in the semiconductor device of this embodiment is electrically connected to the electrodes 9 (9a and 9b) from the active area 18 via the element wiring layers 19 and is further connected to the multilayer circuit board 1 via the bumps 10 (10a and 10b). In this structure, a barrier metal 21 for preventing the deterioration of the material due to the atomic diffusion between the bump 10 and the electrode 9 is formed between the bump 10 and the electrode 9. In the structure shown in FIG. 5, since the bump 10a and the bump 10b do not have the same potential, each of them is isolated by element insulating layers 20a, 20b, and 20c such as an interlayer insulating film and a passivation film.

Also, the source or emitter electrode 9b is connected to a ground electrode on the rear surface of the multilayer circuit board 1 via the interlayer connection vias 15 and the thermal vias 8 formed in the interlayer circuit board 1. The heat generated in the active area is transmitted to the multilayer circuit board 1 mainly via the electrical connection bump 10, and the heat in the interlayer circuit board 1 is released to the outside of the semiconductor device mainly via the thermal vias 8.

When various types of electrodes form a complex and complicated structure as shown in FIG. 4, extension of the wirings are required at least in the upper first and second wiring layers of the multilayer circuit board 1 from the side close to the mounting surface of the semiconductor element 7. Therefore, in the structure of this embodiment, two different source or emitter electrodes 9b of the signal amplifier circuits are short-circuited in the third and lower layers of the wiring layers to form a large number of common thermal vias 8, and at the same time, the extension of the wirings for the control circuit electrode 9c and the drain or gate electrode or collector or base electrode 9a is formed in the first and second layers. However, if the extension of the wirings from the electrodes 9a and 9c can be formed in only the first layer, the thermal vias which connect the electrode 9b and the ground electrode can be formed in the second and lower wiring layers. An example of such a case is shown in FIG. 6. Of course, it is also possible to form the thermal vias 8 from the portion just below the first wiring layer. In this case, it is necessary to dispose the thermal vias 8 so as not to short-circuit with the electrodes 9a and 9c.

According to this embodiment, since the heat radiation bump and the electrical connection bump are formed of the same material and have the same thickness, the complexity of the structure due to the difference in the linear expansion coefficient and bump height can be solved, and all bumps can be formed and the semiconductor element 7 can be packaged at low cost. Further, since the thermal vias which short-circuit the source or emitter electrode and the ground electrode are formed in the third and lower wiring layers or the second and lower wiring layers of the multilayer circuit board 1, it is possible to form the extension of the wirings in the surface layer (first layer) and the second layer of the circuit board which is required in the flip chip packaging structure, while improving the radiation performance of the multilayer circuit board. Also, it is desired that the first and second layers of the multilayer circuit board 1 have a thickness smaller than that of the third and lower layers thereof.

Also, regarding the structure shown in the cross-sectional view of FIG. 5, the number of interlayer connection vias 15 connected to the thermal vias 8 can be increased and the sectional area thereof can be increased in comparison with those on the side of the drain or gate electrode (or collector or base electrode) 9a as shown in FIG. 7 and FIG. 8. In this case, since the heat transmitted to the multilayer circuit board 1 via the source electrode (or emitter electrode) 9b is efficiently transmitted to the thermal vias 8, the radiation performance can be further improved.

Also, in this embodiment, the source electrode (or emitter electrode) 9b and the source bump (or emitter bump) 10b in parallel with each other are separately disposed as shown in FIG. 9.

In other embodiments of the present invention described below, the drain or gate electrode or collector or base electrode 9a, the source or emitter electrode 9b, the drain or gate bump or collector or base bump 10a, and the source or emitter bump 10b may be abbreviated to a drain or gate electrode 9a, a source electrode 9b, a drain or gate bump 10a, and a source bump 10b, respectively.

Second Embodiment

Figure 10:
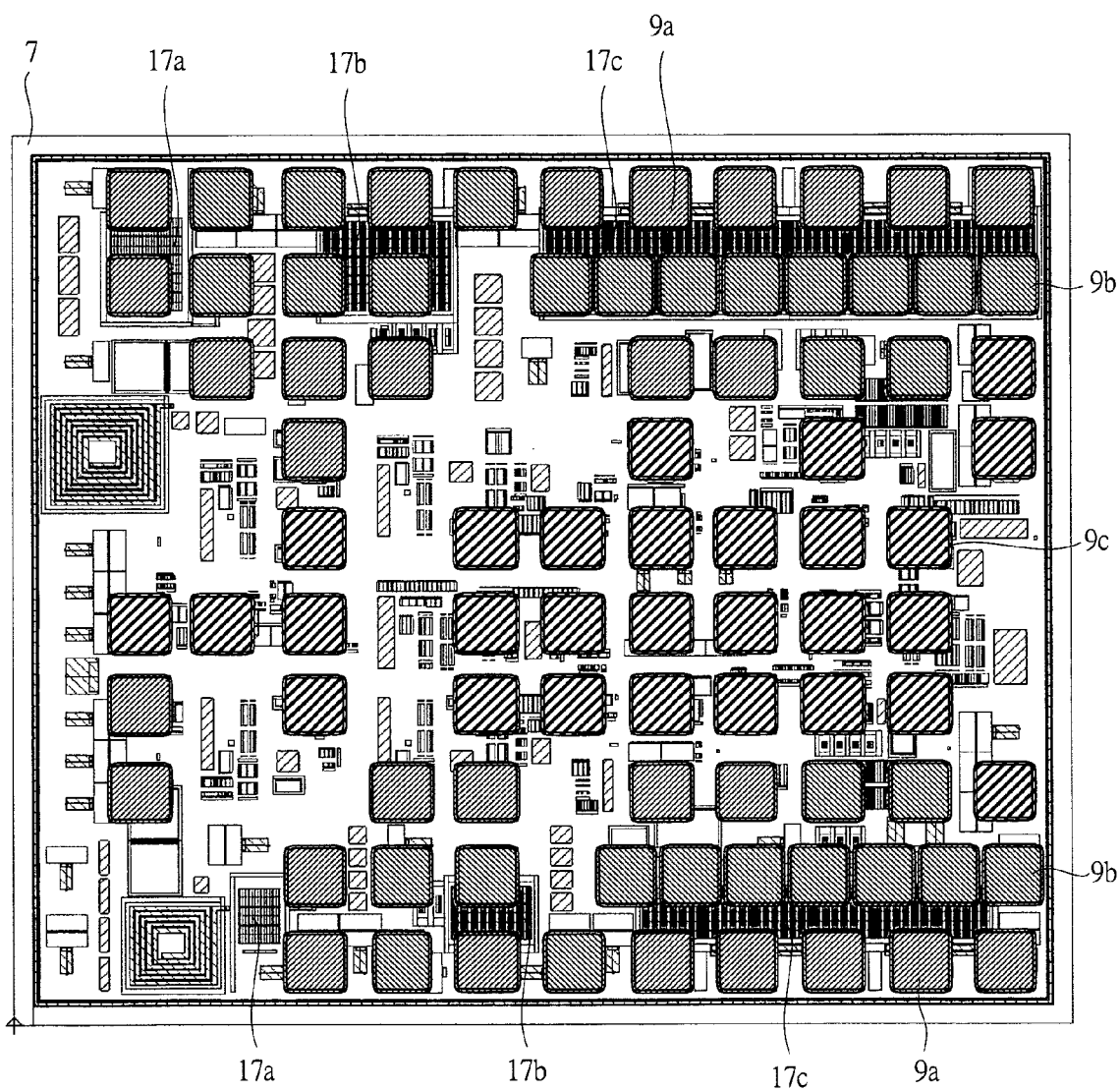
FIG. 10 is a diagram showing an example where source electrodes are closely aligned in the layout of the element bump electrodes in the semiconductor device according to the second embodiment of the present invention.
Figure 11:
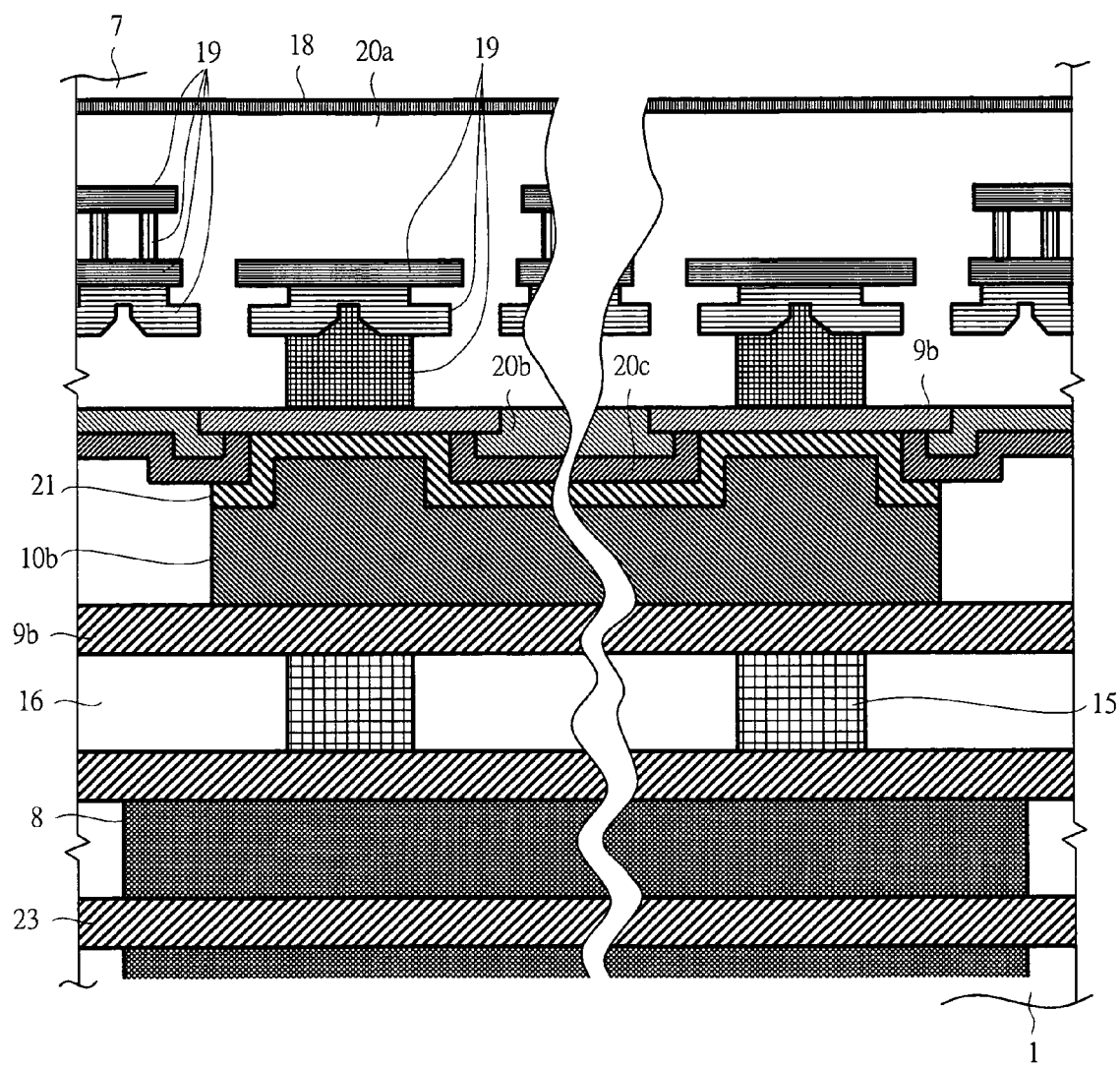
FIG. 11 is a cross-sectional view showing a connection structure from an active area to a thermal via in the wiring layers on the source or emitter side in the semiconductor device according to the second embodiment of the present invention.
Figure 12:
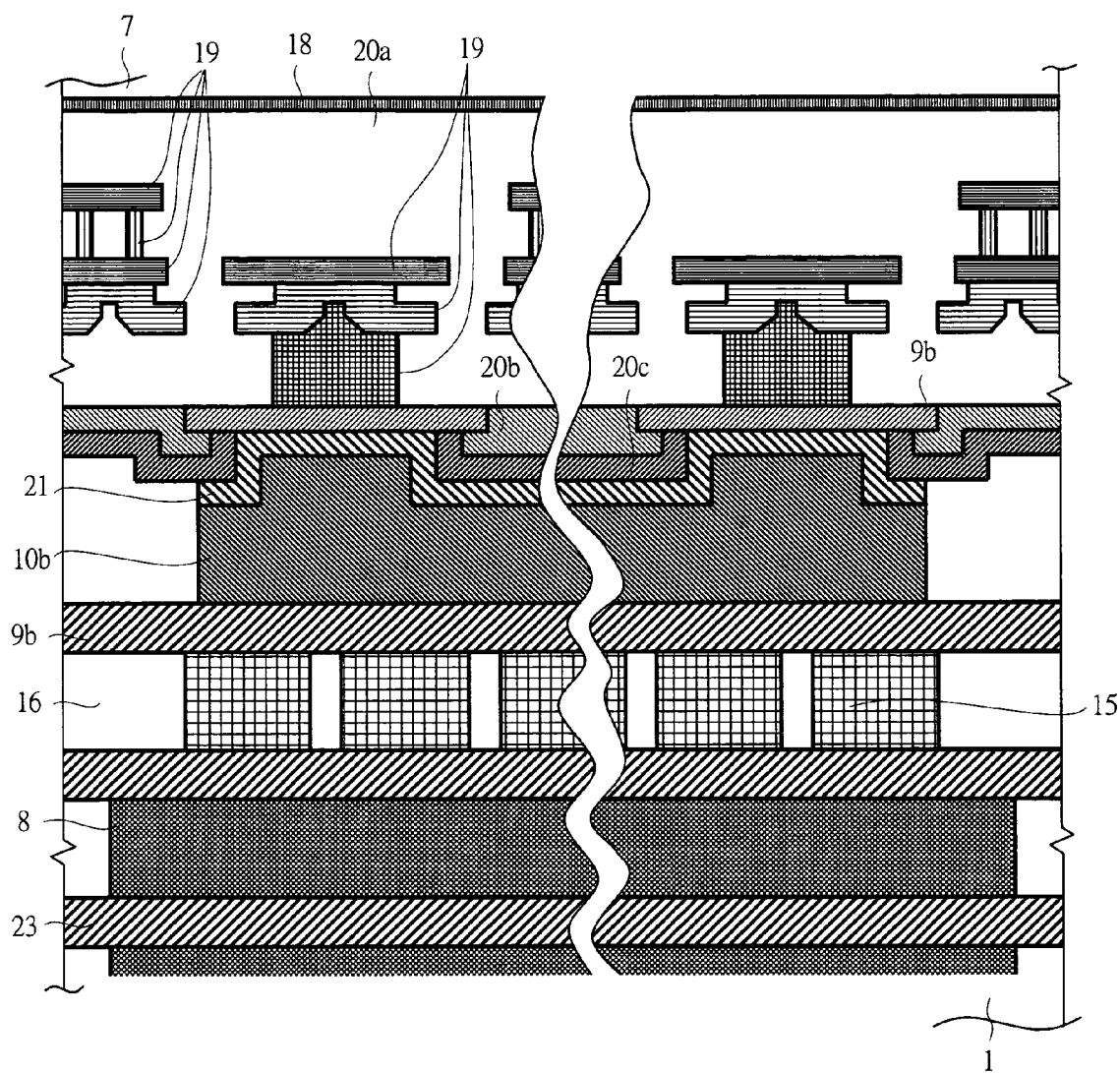
FIG. 12 is a cross-sectional view showing another connection structure from an active area to a thermal via in the wiring layers on the source or emitter side in the semiconductor device according to the second embodiment of the present invention.
Figure 13:
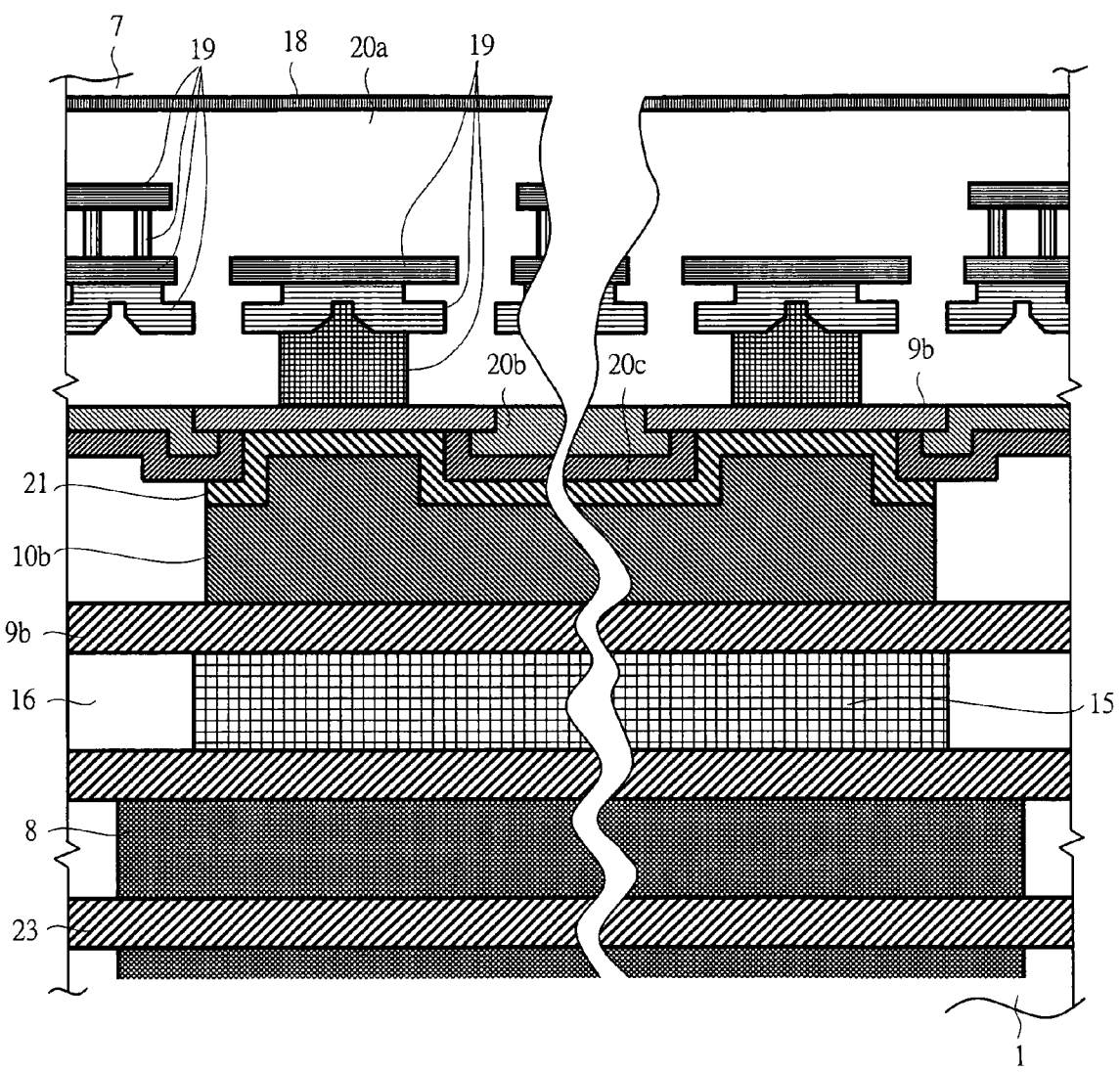
FIG. 13 is a cross-sectional view showing still another connection structure from an active area to a thermal via in the wiring layers on the source or emitter side in the semiconductor device according to the second embodiment of the present invention.

A semiconductor device according to the second embodiment of the present invention will be described with reference to FIG. 10 to FIG. 13. FIG. 10 is a diagram showing an example where source electrodes are closely aligned in the layout of the element bump electrodes in the semiconductor device. FIG. 11 is a cross-sectional view showing the connection structure from an active area to a thermal via in the wiring layers on the source or emitter side in the semiconductor device. FIG. 12 is a cross-sectional view showing another connection structure from an active area to a thermal via in the wiring layers on the source or emitter side in the semiconductor device. FIG. 13 is a cross-sectional view showing still another connection structure from an active area to a thermal via in the wiring layers on the source or emitter side in the semiconductor device. Note that the cross-sectional structures of the semiconductor device of this embodiment which do not overlap with FIG. 10 to FIG. 13 are similar to those of FIG. 3 and FIG. 5 to FIG. 9.

The feature of this embodiment lies in that, in the electrode layout shown in FIG. 4, the pitch of the source electrodes 9b aligned in parallel near the output stage 17c of the active area for signal amplification is made narrower than that of opposing drain or gate electrodes 9a.

In this embodiment, the total area of the cross sections of the source electrodes 9b near the output stage 17c with the largest heating value in the active area for signal amplification is increased in comparison with the embodiment shown in FIG. 4. Therefore, the total area of the cross sections of the source bumps 10b is also increased, and the heat flux passing through the source bumps 10b is relatively reduced. Consequently, the thermal resistance can be reduced.

The source bumps 10b are preferably aligned as shown in the cross-sectional view of FIG. 9 in this embodiment. However, if the source electrodes 9b are formed close to each other and a low-melting metal such as solder is used for the source bumps 10b, the source bumps 10b are melted and united to each other to form a large strip-shaped bump in the reflow process thereof in some cases although the source electrodes 9b on the side of the semiconductor element 7 are isolated by element insulating layers 20b and 20c such as a passivation film and others as shown in the cross-sectional view of FIG. 11. In this case, if the melting and uniting of the bumps can be anticipated in advance, the source electrode 9b of the multilayer circuit board 1 on the reception side may have a form obtained by uniting a plurality of the source electrodes 9b with the same potential as shown in FIG. 11.

Also, in the cross-sectional view of FIG. 11, the interlayer connection vias 15 for connecting the source electrodes 9b and the thermal vias 8 are provided for the source bumps 10b in a one-to-one manner. However, the number of interlayer connection vias 15 and the area thereof can be increased in order to improve the radiation performance as shown in FIG. 12 and FIG. 13. By this means, the radiation performance can be further improved.

Third Embodiment

Figure 14:
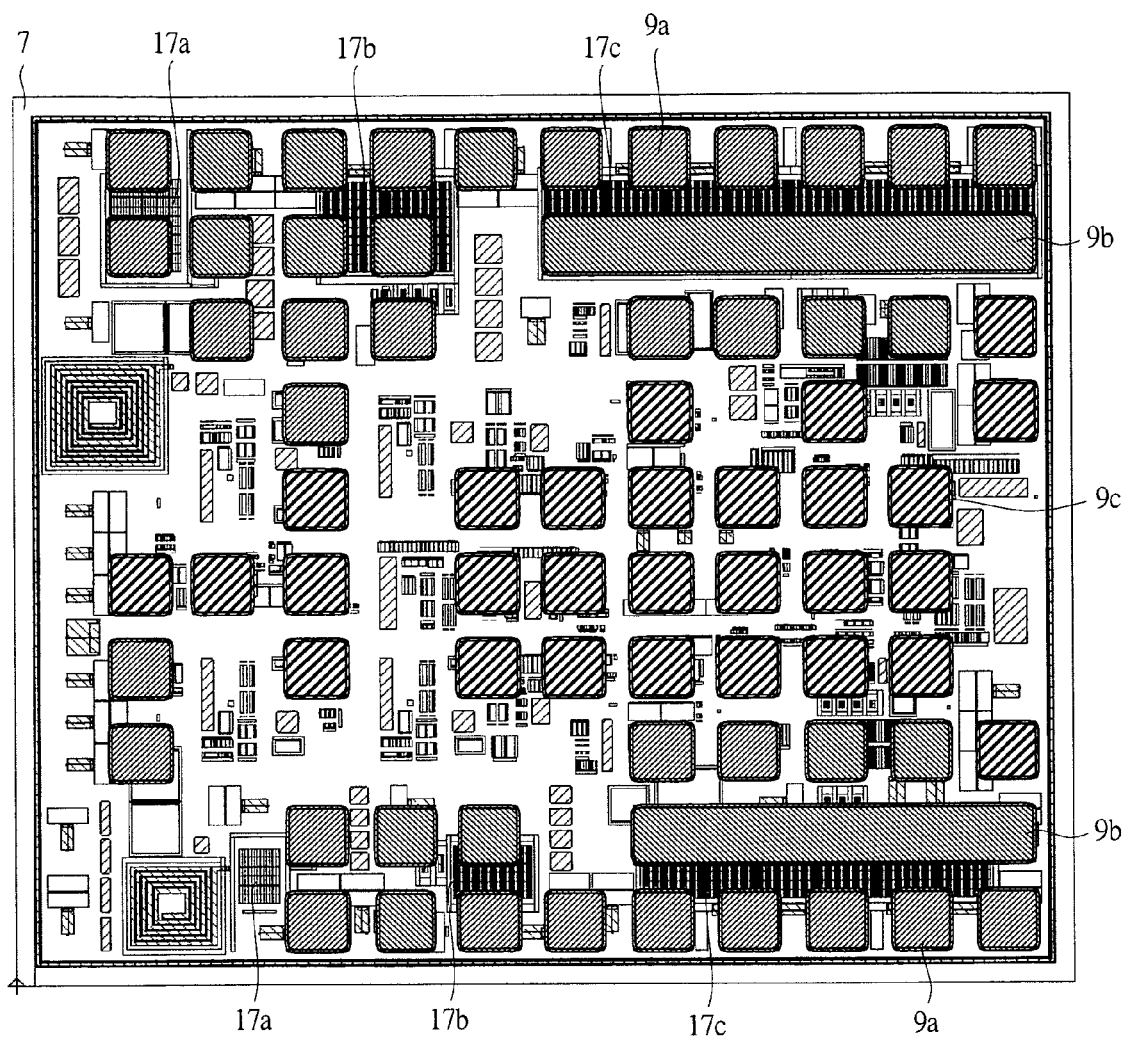
FIG. 14 is a diagram showing an example where source electrodes are united to form a strip-shaped electrode in the layout of the element bump electrodes in the semiconductor device according to the third embodiment of the present invention.
Figure 15:
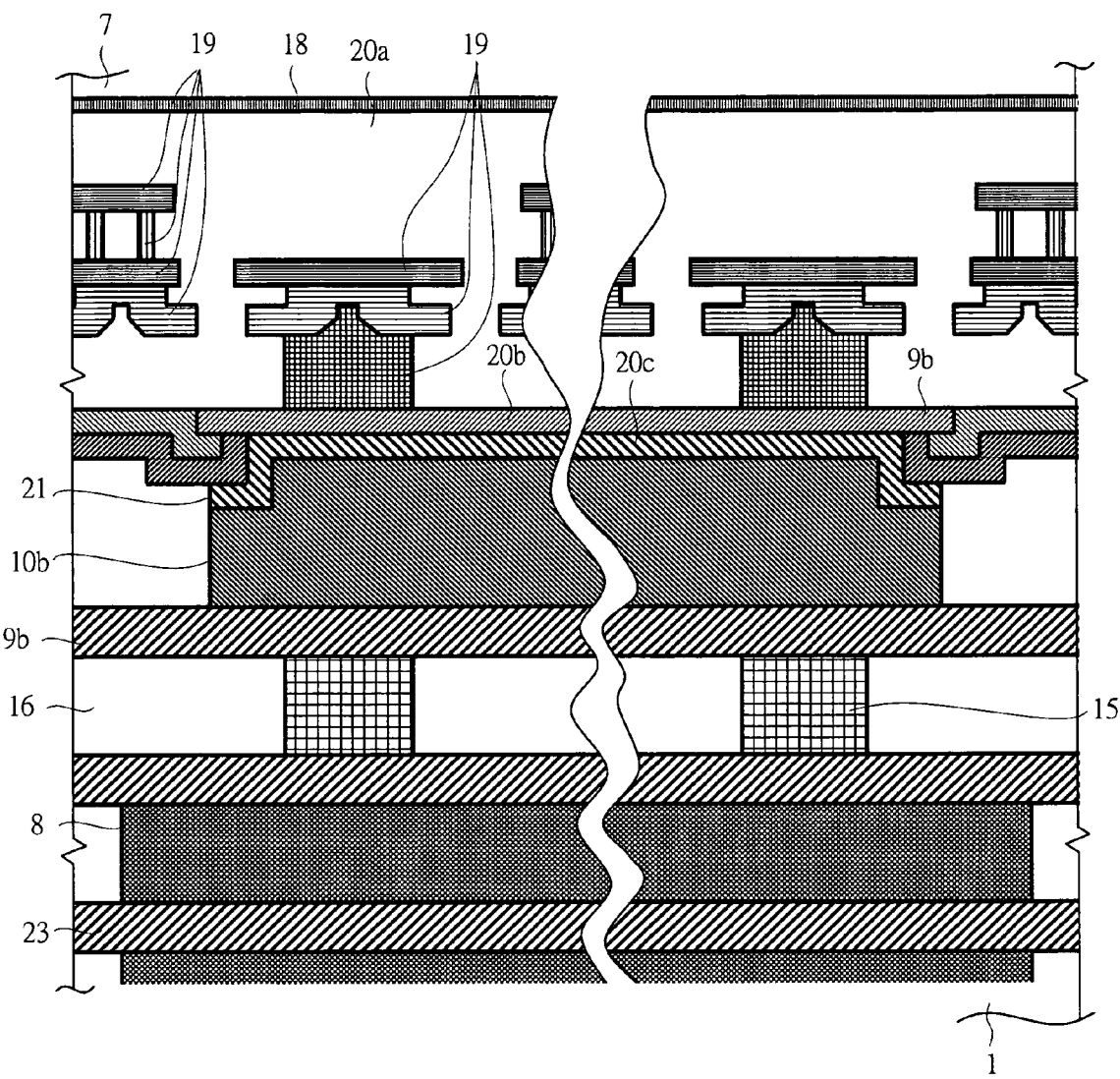
FIG. 15 is a cross-sectional view showing a connection structure from an active area to a thermal via in the wiring layers on the source or emitter side in the semiconductor device according to the third embodiment of the present invention.
Figure 16:
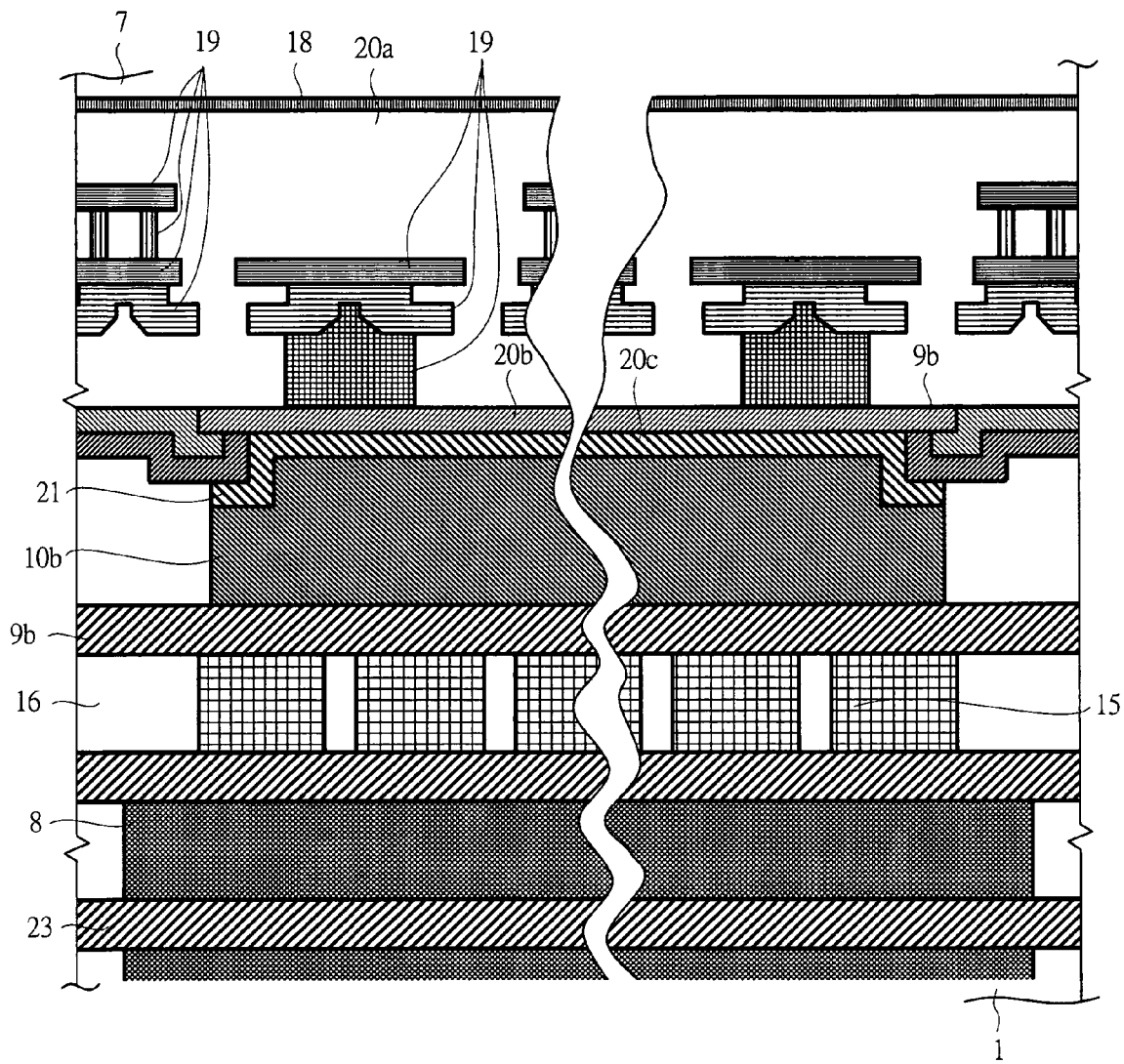
FIG. 16 is a cross-sectional view showing another connection structure from an active area to a thermal via in the wiring layers on the source or emitter side in the semiconductor device according to the third embodiment of the present invention.
Figure 17:
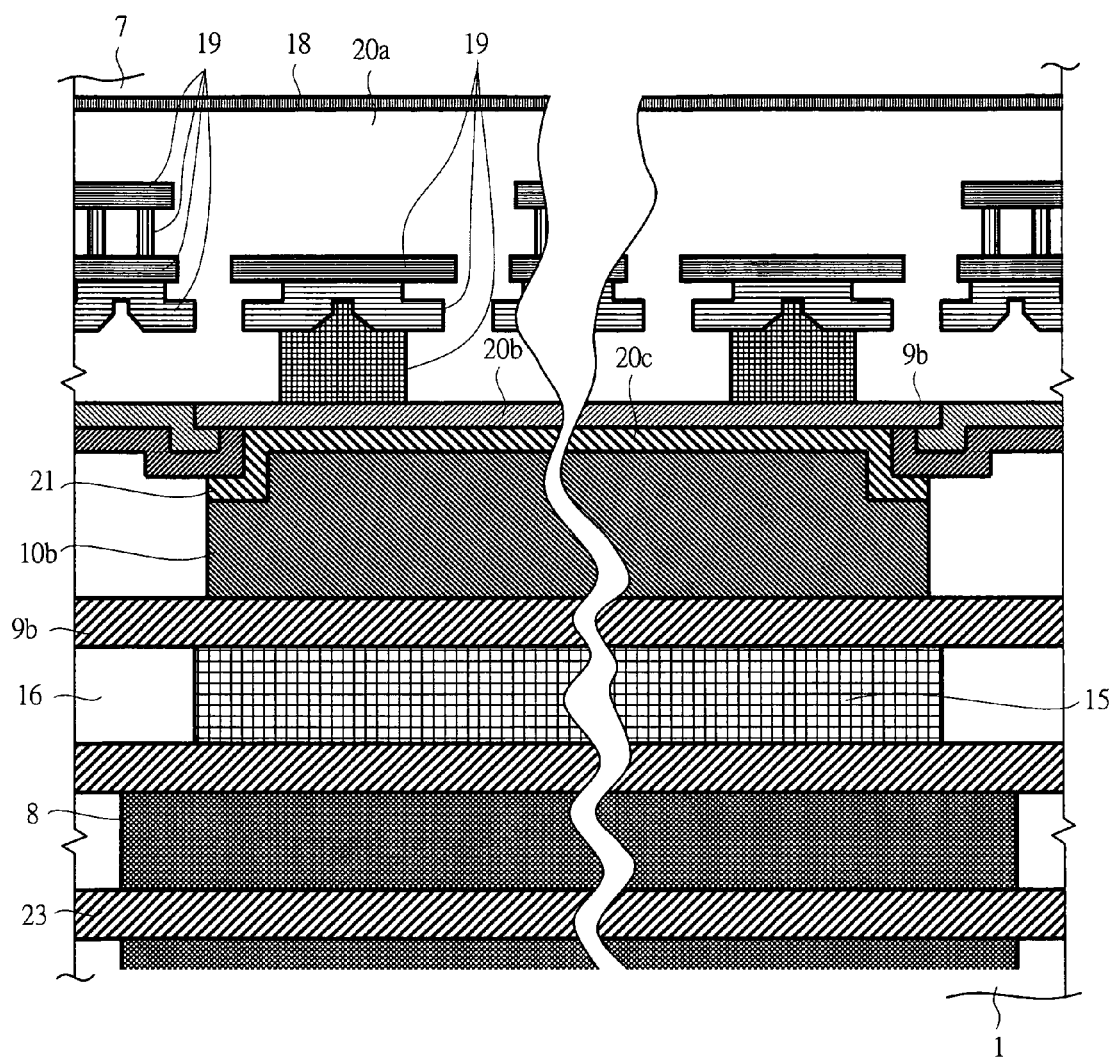
FIG. 17 is a cross-sectional view showing still another connection structure from an active area to a thermal via in the wiring layers on the source or emitter side in the semiconductor device according to the third embodiment of the present invention.
Figure 18:
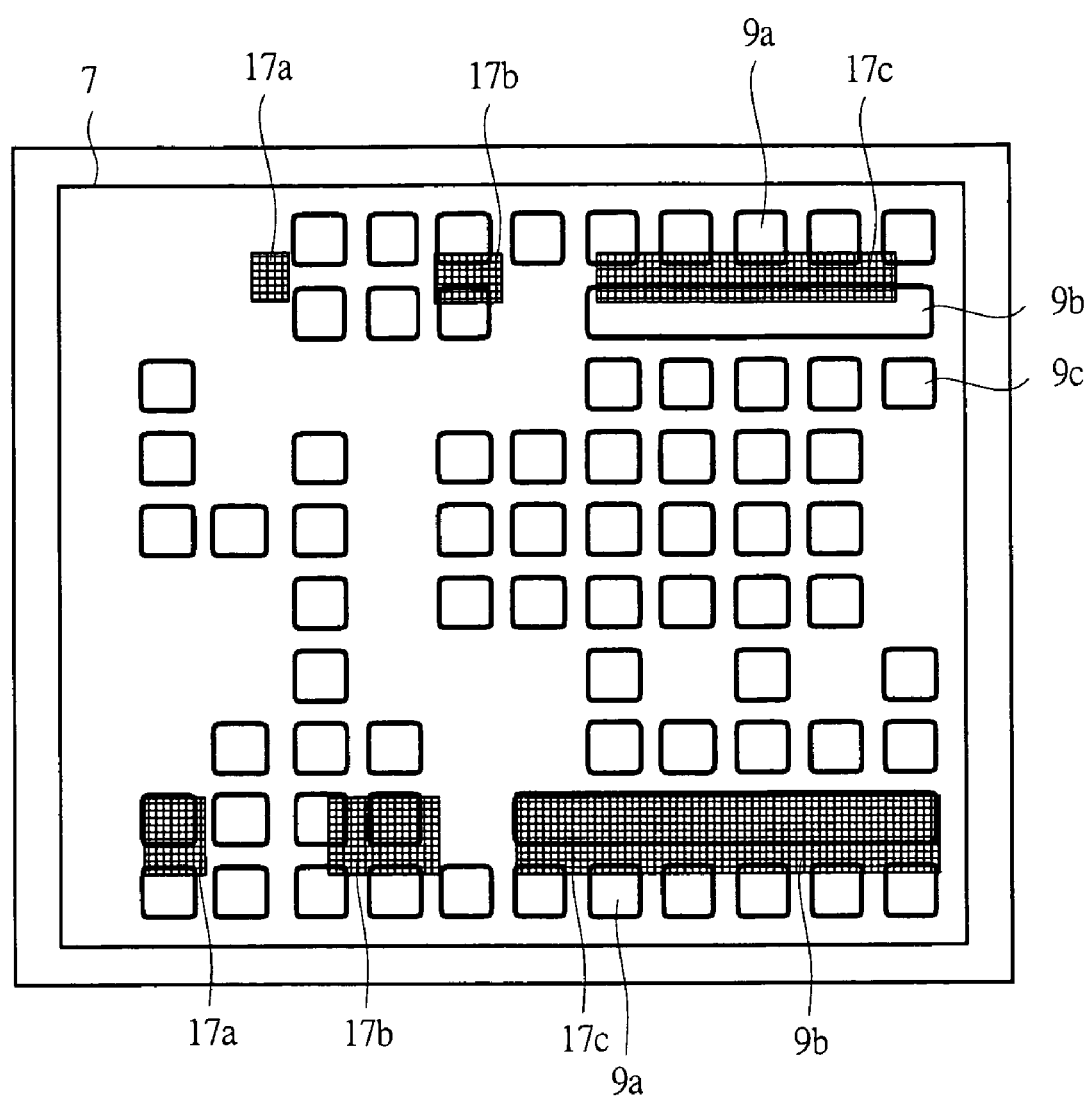
FIG. 18 is a perspective view showing a positional relation between the bump electrode and the active area at the time when a circuit board is packaged in the example where the source electrodes are united to form a strip-shaped electrode in the layout of the element bump electrodes in the semiconductor device according to the third embodiment of the present invention.

A semiconductor device according to the third embodiment of the present invention will be described with reference to FIG. 14 to FIG. 18. FIG. 14 is a diagram showing an example where source electrodes are united to form a strip-shaped electrode in the layout of the element bump electrodes in a semiconductor device. FIG. 15 is a cross-sectional view showing a connection structure from an active area to a thermal via in the wiring layers on the source or emitter side in the semiconductor device. FIG. 16 is a cross-sectional view showing another connection structure from an active area to a thermal via in the wiring layers on the source or emitter side in the semiconductor device. FIG. 17 is a cross-sectional view showing still another connection structure from an active area to a thermal via in the wiring layers on the source or emitter side in the semiconductor device. FIG. 18 is a perspective view showing the positional relation between the bump electrode and the active area at the time when a circuit board is packaged in the example where the source electrodes are united to form a strip-shaped electrode in the layout of the element bump electrodes in a semiconductor device. Note that the cross-sectional structures of the semiconductor device of this embodiment which do not overlap with FIG. 14 to FIG. 17 are similar to those of FIG. 3 and FIG. 5 to FIG. 9.

The feature of this embodiment lies in that the source electrodes 9b near the output stage 17c in the active area for signal amplification are united to form a strip-shaped electrode as shown in FIG. 14 and source bumps 10b corresponding thereto are linearly aligned as a strip-shaped bump. As the cross-sectional structure parallel to the strip-shaped source bump 10b, the structure as shown in FIG. 15, FIG. 16, or FIG. 17 may be adopted. Also, the total cross-sectional area of the interlayer connection vias 15 penetrating through the first layer of the insulating layer 16 of the multilayer circuit board 1 is larger in FIG. 16 than that in FIG. 15 and is larger in FIG. 17 than that in FIG. 16, and the radiation performance on the side of the multilayer circuit board 1 is accordingly improved.

In this embodiment, the source bump 10b has a large-area strip shape. Therefore, the radiation performance of the bumps near the output stage 17c which are the main heat generating areas is improved, and the thermal resistance of the semiconductor device can be further reduced.

Also, FIG. 18 is a perspective view showing the positional relation between the electrical connection electrodes (9a, 9b, 9c) and the active areas (17a, 17b, 17c) in this embodiment seen from above the semiconductor device in the case where the semiconductor element 7 is packaged on the multilayer circuit board 1. As shown in FIG. 18, the active area of the output stage 17*c* and the range of the strip-shaped source electrode 9*b* almost overlap particularly in the lower layout of FIG. 18 (on the side of output stage 17*c* with larger area). In such a layout, since most of the heat generated in the output stage 17*c* flows almost directly into the source bump 10*b* though it passes through a part of the element insulating layer 20*a*, the effect of reducing the thermal resistance is large. Therefore, in the other embodiments of the present invention described later and shown in FIG. 19 to FIG. 22, the source bumps 10*b* or the drain or gate bumps 10*a* whose cross-sectional areas are further increased are aligned. Consequently, although the further reduction of thermal resistance than this embodiment can be achieved, the effect is restrictive.

Fourth Embodiment

Figure 19:
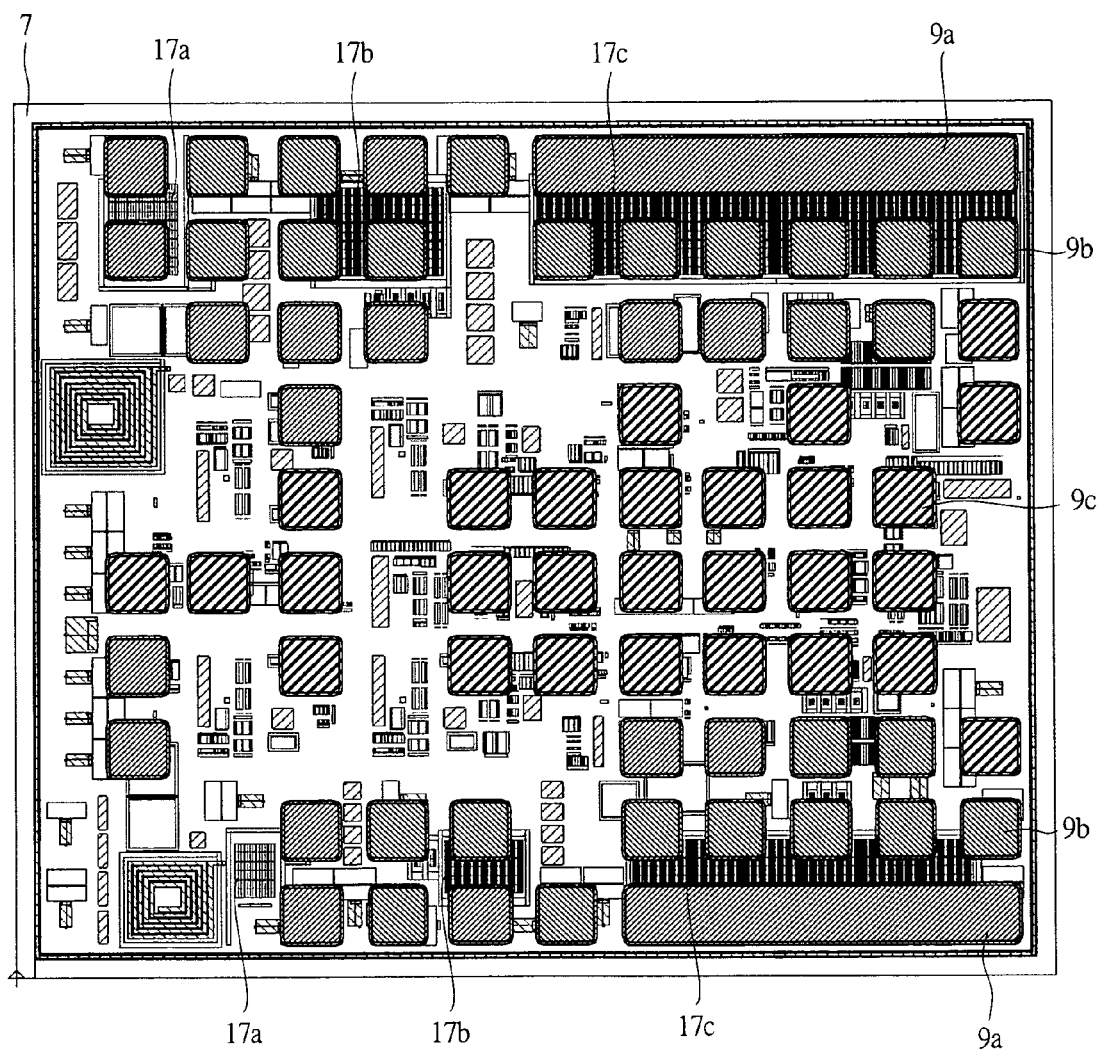
FIG. 19 is a diagram showing an example where the drain or gate electrodes are united to form a strip-shaped electrode in the layout of the element bump electrodes in the semiconductor device according to the fourth embodiment of the present invention.

A semiconductor device according to the fourth embodiment of the present invention will be described with reference to FIG. 19. FIG. 19 is a diagram showing an example where the drain or gate electrodes are united to form a strip-shaped electrode in the layout of the element bump electrodes in the semiconductor device shown in FIG. 19. Note that, through the sectional structure of this embodiment is not illustrated, all of the sectional structures obtained by the combination of the cross-sectional views shown in FIG. 3 to FIG. 18 are included therein.

The feature of this embodiment lies in that the drain or gate electrodes 9*a* near the output stage 17*c* in the active area for signal amplification are united to form a strip-shaped electrode and drain or gate bumps 10*a* corresponding thereto are also united to form a strip-shaped bump as shown in FIG. 19. Since the drain or gate bumps 10*a* are formed into a large-area strip-shaped electrode, the radiation performance of the bumps near the output stage 17*c* which are the main heat generating areas is improved, and the further reduction of the thermal resistance of the semiconductor device can be achieved.

Fifth Embodiment

Figure 20:
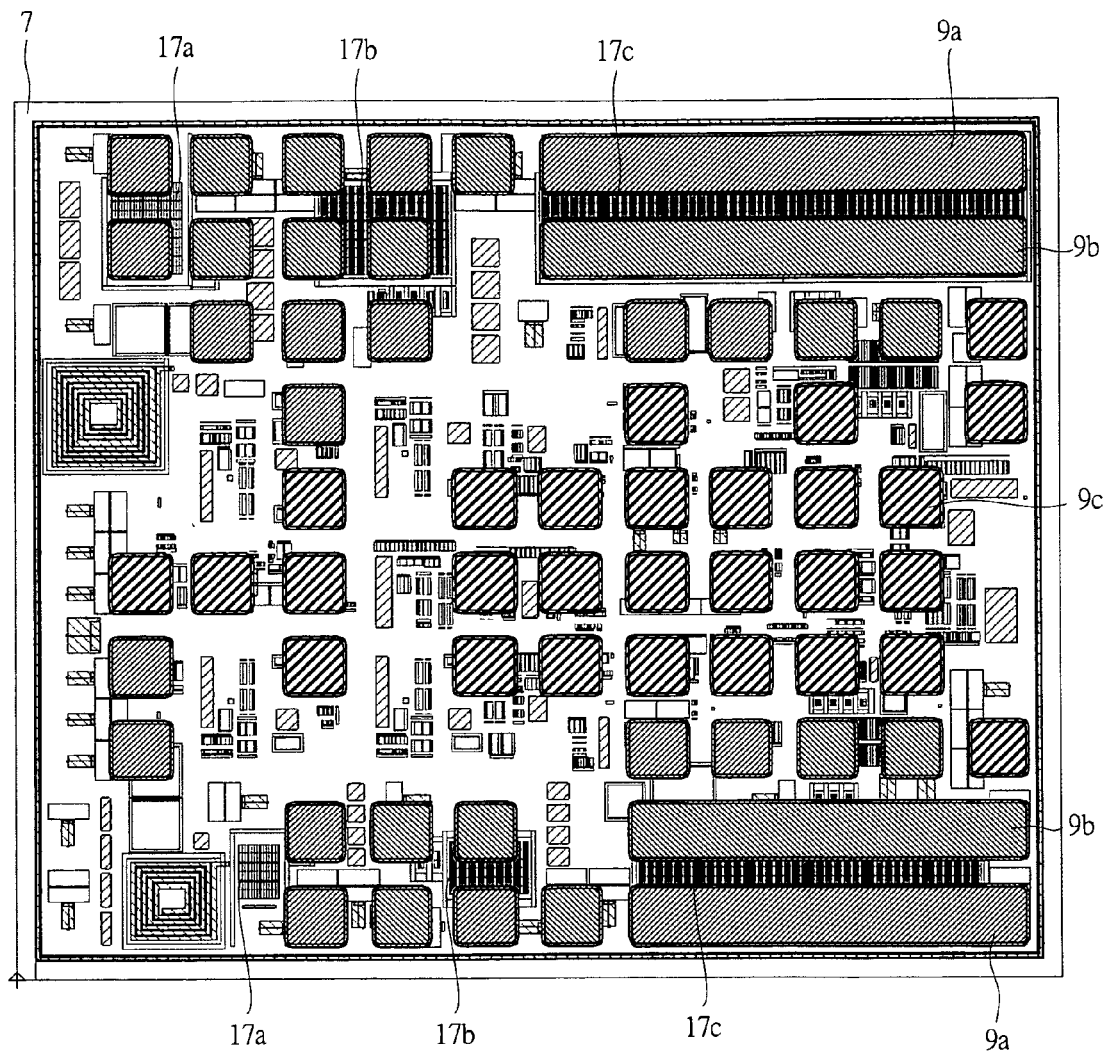
FIG. 20 is a diagram showing an example where the drain or gate electrodes and the source electrodes are respectively united to form strip-shaped electrodes in the layout of the element bump electrodes in the semiconductor device according to the fifth embodiment of the present invention.
Figure 21:
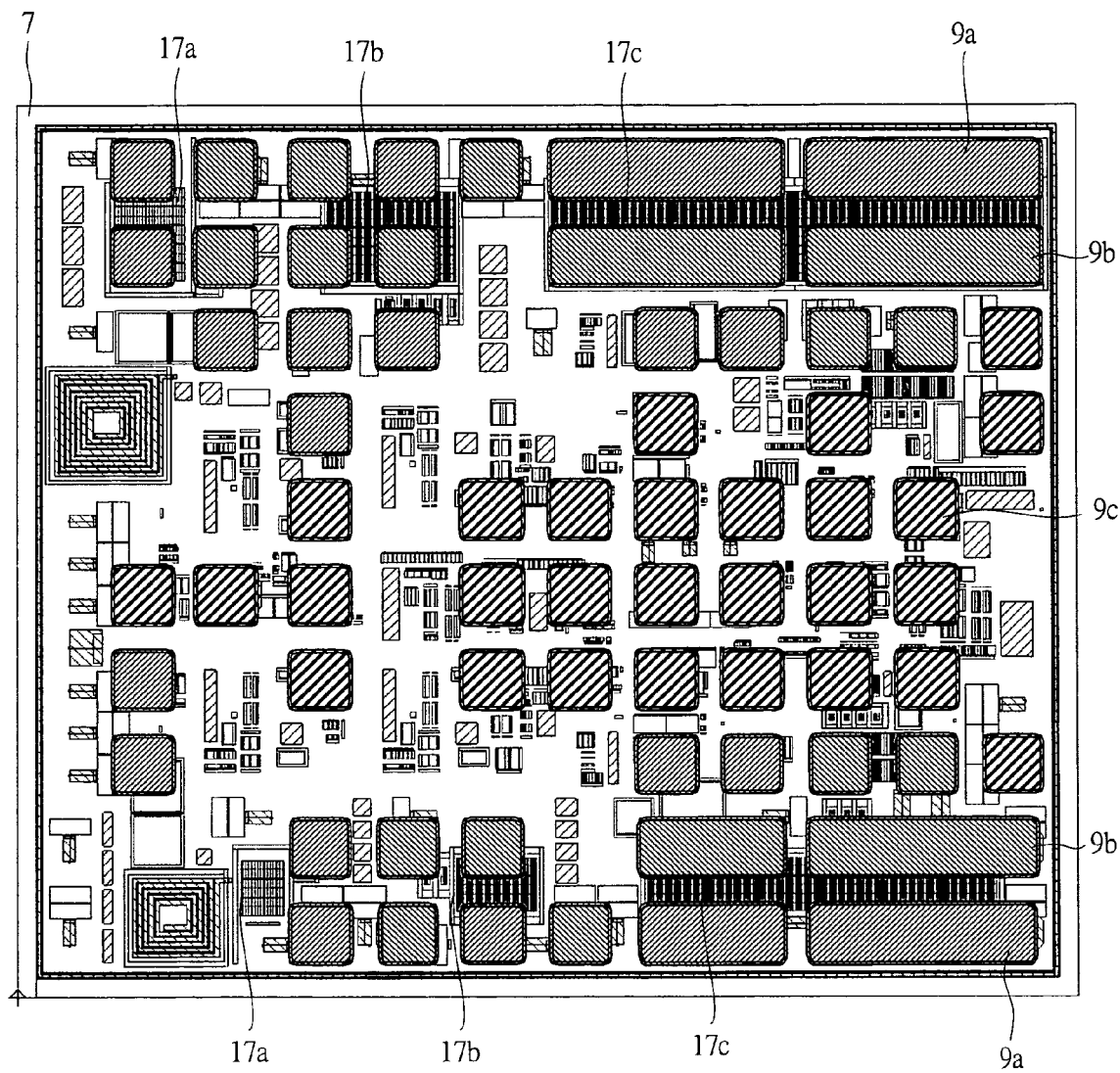
FIG. 21 is a diagram showing an example where the drain or gate electrodes and the source electrodes are united to form several strip-shaped electrodes in the layout of the element bump electrodes in the semiconductor device according to the fifth embodiment of the present invention.
Figure 22:
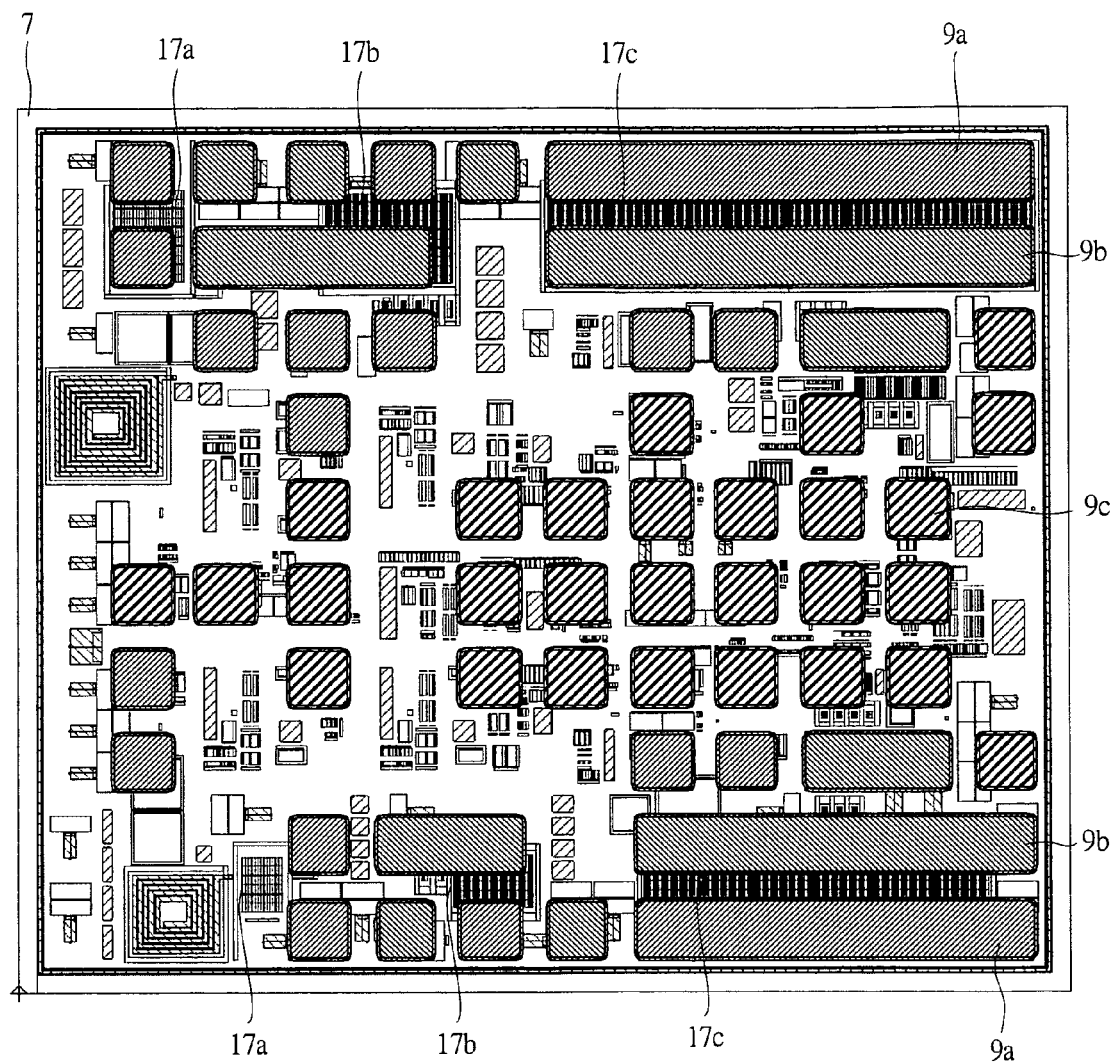
FIG. 22 is a diagram showing an example where the drain or gate electrodes and the source electrodes each having the same potential and on the same row are united to form strip-shaped electrodes in the layout of the element bump electrodes in the semiconductor device according to the fifth embodiment of the present invention.

A semiconductor device according to the fifth embodiment of the present invention will be described with reference to FIG. 20 to FIG. 22. FIG. 20 is a diagram showing an example where the drain or gate electrodes and the source electrodes are respectively united to form strip-shaped electrodes in the layout of the element bump electrodes in the semiconductor device. FIG. 21 is a diagram showing an example where the drain or gate electrodes and the source electrodes are united to form several strip-shaped electrodes in the layout of the element bump electrodes in the semiconductor device. FIG. 22 is a diagram showing an example where the drain or gate electrodes and the source electrodes each having the same potential and on the same row are united to form strip-shaped electrodes in the layout of the element bump electrodes in the semiconductor device.

In this embodiment, the source electrodes 9*b* and the drain or gate electrodes 9*a* respectively form the strip-shaped electrodes near the output stage 17*c*, and the sectional areas of the drain or gate bumps 10*a* and the source bumps 10*b* are expanded. Therefore, the thermal resistance can be reduced more than the embodiment shown in FIG. 19 through slightly.

Sixth Embodiment

A semiconductor device according to the sixth embodiment of the present invention will be described with reference to FIG. 23. FIG. 23 is a diagram showing the example where the emitter electrodes of HBTs are united to form a strip-shaped electrode in the layout of the element bump electrodes in the semiconductor device.

Different from the other embodiments, this embodiment shows an example of the electrode layout where HBTs (Heterojunction Bipolar Transistor) are formed on a GaAs (Gallium Arsenide) wafer which is a compound semiconductor and the HBT elements are flip-chip packaged.

In FIG. 23, the strip-shaped emitter electrode 9*b* is formed on the emitter wiring, and the strip-shaped emitter bump 10*b* is used to connect the emitter electrode 9*b* and the multilayer circuit board 1. By this means, the heat from the heat generating area can be efficiently transmitted to the multilayer circuit board 1 and the thermal resistance can be reduced.

The embodiments of the present invention are characterized in that square electrodes and strip-shaped electrodes have almost the same width in a longitudinal direction and are almost linearly aligned in parallel in a lateral direction of FIG. 4, FIG. 10, FIG. 14, FIG. 18, FIG. 19, FIG. 20, FIG. 21, and FIG. 22. In the layout drawings in FIG. 4, FIG. 10, FIG. 14, and FIG. 18 to FIG. 21, there are the source electrodes 9*b* which extend across some columns. However, the electrodes with the same potential are not united in such a form. If a void in which the underfill resin is not appropriately filled is formed when filling the underfill resin, it causes the solder flash and the phreatic explosion. Therefore, when the spread of the underfill resin is taken into consideration, the spread is hindered if there are S-shaped or L-shaped bumps. Therefore, in the present invention, the bumps with a bent portion such as an S-shaped portion or an L-shaped portion are not formed. By this means, the occurrence rate of the failure can be reduced, and the robustness of the packaging process can be improved.

Also, it is important in the embodiments of the present invention that all components and submodules to be mounted on a circuit board other than the semiconductor element 7 including submodules 24 are mounted through the same bump formation process and packaging process as shown in FIG. 24. By this means, the process cost can be significantly reduced. It is needless to say that the packaging elements include a second semiconductor element other than the semiconductor element 7.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be utilized for a technology of a thermal design of a semiconductor device for a radio-frequency transmitter and receiver module and a semiconductor power supply mounted in a personal digital assistant such as a cellular phone.

What is claimed is:

1. A semiconductor device having a semiconductor circuit for signal amplification and a control circuit for controlling said semiconductor circuit for signal amplification which are laminated on a first layer of a multilayer circuit board, wherein said semiconductor circuit for signal amplification has a plurality of amplifier circuits aligned in parallel in order to amplify signals of plural bands, said semiconductor circuit for signal amplification and said control circuit are aligned in parallel on the same semiconductor element so that said control circuit is surrounded by said plurality of amplifier circuits, said semiconductor element is mounted by a flip chip connection on said circuit board, and pitch of source bump electrodes or emitter bump electrodes aligned in parallel is narrower than a pitch of drain bump electrodes or gate bump electrodes or collector bump electrodes or base bump electrodes aligned in parallel in a layout of bump electrodes which electrically connect said semiconductor element and said circuit board, wherein the source bump electrodes or emitter bump electrodes a portion of third subsequent layers of the multilayer circuit board, as viewed from the semiconductor circuit, are connected to a ground electrode of the multilayer circuit board by common thermal vias for heat radiation.

2. A semiconductor device having a semiconductor circuit for signal amplification and a control circuit for controlling said semiconductor circuit for signal amplification which are laminated on a first layer of a multilayer circuit board, wherein said semiconductor circuit for signal amplification has a plurality of amplifier circuits aligned in parallel in order to amplify signals of plural bands, said semiconductor circuit for signal amplification and said control circuit are aligned in parallel on the same semiconductor element so that said control circuit is surrounded by said plurality of amplifier circuits, said semiconductor element is mounted by a flip chip connection on said circuit board, and at least some of bumps having the same potential and aligned in parallel are united to form a strip-shaped electrode in a layout of bump electrodes which electrically connect said semiconductor element and said circuit board, wherein source bump electrodes or emitter bump electrodes of the bump electrodes a portion of third and subsequent layers of the multilayer circuit board, as viewed from the semiconductor device, are connected to a ground electrode of the multilayer circuit board by common thermal vias for heat radiation.

3. A semiconductor device having a semiconductor circuit for signal amplification and a control circuit for controlling said semiconductor circuit for signal amplification which are laminated on a circuit board, wherein said semiconductor circuit for signal amplification has a plurality of amplifier circuits aligned in parallel in order to amplify signals of plural bands, said semiconductor circuit for signal amplification and said control circuit are aligned in parallel on the same semiconductor element so that said control circuit is surrounded by said plurality of amplifier circuits, said semiconductor element is mounted by a flip chip connection on said circuit board, at least some of bumps having the same potential and aligned in parallel are united to form a strip-shaped electrode in a layout of bump electrodes which electrically connect said semiconductor element and said circuit board, and bumps extending in parallel to said strip-shaped electrode are almost linearly aligned, wherein source bump electrodes or emitter bump electrodes of the bump electrodes a portion of third and subsequent layers of the multilayer circuit board, as viewed from the semiconductor device, are connected to a ground electrode of the multilayer circuit board by common thermal vias for heat radiation.

4. The semiconductor device according to claim 1,
wherein said circuit board is a multilayer circuit board formed from a plurality of wiring layers and insulating layers, and via electrodes which connect said layers, and a first layer and a second layer from a mounting surface of said semiconductor element in said multilayer circuit board have a thickness larger than that of the third layer.

5. The semiconductor device according to claim 2,
wherein said circuit board is a multilayer circuit board formed from a plurality of wiring layers and insulating layers, and via electrodes which connect said layers, and a first layer and a second layer from a mounting surface of said semiconductor element in said multilayer circuit board have a thickness larger than that of the third layer.

6. The semiconductor device according to claim 3,
wherein said circuit board is a multilayer circuit board formed from a plurality of wiring layers and insulating layers, and via electrodes which connect said layers, and a first layer and a second layer from a mounting surface of said semiconductor element in said multilayer circuit board have a thickness larger than that of the third layer.

* * * * *